United States Patent
Hasegawa et al.

(10) Patent No.: US 10,840,936 B2
(45) Date of Patent: Nov. 17, 2020

(54) SENSOR, DRIVING METHOD, AND ELECTRONIC DEVICE

(71) Applicant: SONY SEMICONDUCTOR SOLUTIONS CORPORATION, Kanagawa (JP)

(72) Inventors: Masako Hasegawa, Tokyo (JP); Ryuta Okamoto, Kanagawa (JP); Tomonori Yamashita, Kanagawa (JP); Atsumi Niwa, Kanagawa (JP); Yosuke Ueno, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/316,469

(22) PCT Filed: Jul. 14, 2017

(86) PCT No.: PCT/JP2017/025657
§ 371 (c)(1),
(2) Date: Jan. 9, 2019

(87) PCT Pub. No.: WO2018/021054
PCT Pub. Date: Feb. 1, 2018

(65) Prior Publication Data
US 2019/0305792 A1     Oct. 3, 2019

(30) Foreign Application Priority Data

Jul. 28, 2016 (JP) ................................ 2016-148565

(51) Int. Cl.
*H03M 1/18* (2006.01)
*H03M 1/56* (2006.01)
(Continued)

(52) U.S. Cl.
CPC ............... *H03M 1/18* (2013.01); *H03M 1/56* (2013.01); *H04N 5/374* (2013.01); *H04N 5/378* (2013.01); *H04N 5/357* (2013.01); *H04N 5/3765* (2013.01)

(58) Field of Classification Search
CPC ........ H04N 5/374; H04N 5/378; H04N 5/357; H04N 5/3765; H03M 1/18; H03M 1/56
See application file for complete search history.

(56) References Cited

U.S. PATENT DOCUMENTS 4,691,172 A * 9/1987 Fukahori .................. H03G 3/30
                                                                      330/129
5,699,017 A * 12/1997 Maejima ................ H03G 1/007
                                                                      330/280

(Continued)

FOREIGN PATENT DOCUMENTS

CN          103916608 A       7/2014
EP            2750369 A2       7/2014
(Continued)

OTHER PUBLICATIONS

International Search Report and Written Opinion of PCT Application No. PCT/JP2017/025657, dated Oct. 17, 2017, 09 pages of ISRWO.

*Primary Examiner* — Antoinette T Spinks
(74) *Attorney, Agent, or Firm* — Chip Law Group

(57) ABSTRACT

Provided is an AD conversion unit that includes a comparator to compare an electric signal with a reference signal having a variable level, and performs AD conversion of the electric signal by using a result of the comparison between the electric signal and the reference signal by the comparator. An attenuation unit attenuates the electric signal supplied to the comparator with the amplitude of the electric signal.

9 Claims, 20 Drawing Sheets

(51) Int. Cl.
*H04N 5/378* (2011.01)
*H04N 5/374* (2011.01)
H04N 5/357 (2011.01)
H04N 5/376 (2011.01)

(56) References Cited

U.S. PATENT DOCUMENTS

| | | | | |
|---|---|---|---|---|
| 8,604,962 | B1* | 12/2013 | Lewyn | H03M 1/0863 |
| | | | | 341/161 |
| 9,774,811 | B1* | 9/2017 | Ebihara | H03K 4/502 |
| 2006/0197574 | A1* | 9/2006 | Naviasky | H03F 3/45973 |
| | | | | 327/307 |
| 2013/0127526 | A1* | 5/2013 | Sayuk | H03F 3/45475 |
| | | | | 330/9 |
| 2014/0184844 | A1 | 7/2014 | Muto et al. | |
| 2017/0288690 | A1* | 10/2017 | Shen | H03M 1/066 |

FOREIGN PATENT DOCUMENTS

| | | | | |
|---|---|---|---|---|
| JP | 2014-131147 A | 7/2014 | | |
| JP | 2015-167347 A | 9/2015 | | |
| JP | 2015-231096 A | 12/2015 | | |
| JP | 2015231096 A | * 12/2015 | | H04N 5/378 |
| WO | 2015/186533 A1 | 12/2015 | | |

* cited by examiner

SENSOR, DRIVING METHOD, AND ELECTRONIC DEVICE

CROSS REFERENCE TO RELATED APPLICATIONS

This application is a U.S. National Phase of International Patent Application No. PCT/JP2017/025657 filed on Jul. 14, 2017, which claims priority benefit of Japanese Patent Application No. JP 2016-148565 filed in the Japan Patent Office on Jul. 28, 2016. Each of the above-referenced applications is hereby incorporated herein by reference in its entirety.

TECHNICAL FIELD

The present technology relates to a sensor, a driving method, and an electronic device, and particularly relates to a sensor, a driving method, and an electronic device that are, for example, capable of improving the dynamic range and noise of AD conversion.

BACKGROUND ART

Recently, an electronic device such as a digital (still/video) camera uses, for example, a complementary metal oxide semiconductor (CMOS) image sensor has been used as a solid-state image capturing device configured to capture an image.

In the CMOS image sensor, an analog to digital converter (ADC) compares, for example, an electric signal obtained from a pixel with a reference signal having a variable level, and analog-to-digital (AD) conversion of the electric signal obtained from the pixel is performed by using a result of the comparison between the electric signal and the reference signal.

Examples of an AD conversion scheme employed by the CMOS image sensor include a line-parallel AD conversion scheme that performs, in parallel, AD conversion of electric signals obtained from a plurality of pixels such as pixels on one horizontal line.

Note that, to accurately convert analog pixel voltage into a digital signal, a disclosed image sensor amplifies the analog pixel voltage by setting a high amplification factor in a case where the analog pixel voltage is small or a low amplification factor in a case where the analog pixel voltage is large, thereby avoiding saturation of the analog pixel voltage (refer to Patent Literature 1, for example).

CITATION LIST

Patent Document

Patent Document 1: Japanese Patent Laid-open No. 2015-167347

SUMMARY OF THE INVENTION

Problems to be Solved by the Invention

Recently, the saturation charge amount of a pixel included in a CMOS image sensor has been increasing along with improvement of the characteristic of the pixel. In addition, the power voltage of the CMOS image sensor has been decreased in accordance with a request for power saving.

Due to the increase of the saturation charge amount and the decrease of the power voltage as described above, it is becoming difficult for the dynamic range of an ADC to cover a pixel signal as an electric signal corresponding to electric charge charged at a pixel.

It is possible to increase the dynamic range of the ADC by setting a low analog gain to the ADC. However, the low analog gain leads to a large quantization step (width) in AD conversion, which degrades quantization noise at a dark part of an object having a large tone difference.

For the above-described reasons, improvement of the dynamic range and noise of AD conversion has been requested for the CMOS image sensor.

In addition, the improvement of the dynamic range and noise of AD conversion has been requested not only for the CMOS image sensor but also for AD conversion of an electric signal obtained by a sensor configured to sense an optional physical quantity.

The present technology has been made in view of such a situation, and is intended to make it possible to improve the dynamic range and noise of AD conversion.

Solutions to Problems

A sensor according to the present technology includes: an AD conversion unit that includes a comparator configured to compare an electric signal obtained by sensing a physical quantity with a reference signal having a variable level and performs analog-to-digital (AD) conversion of the electric signal by using a result of the comparison between the electric signal and the reference signal by the comparator; and an attenuation unit configured to attenuate the electric signal input to the comparator in accordance with an amplitude of the electric signal.

A driving method according to the present technology is performed by a sensor including an AD conversion unit that includes a comparator configured to compare an electric signal obtained by sensing a physical quantity with a reference signal having a variable level and performs analog-to-digital (AD) conversion of the electric signal by using a result of the comparison between the electric signal and the reference signal by the comparator. The driving method includes a step of attenuating the electric signal input to the comparator in accordance with an amplitude of the electric signal.

An electronic device according to the present technology includes: an optical system configured to condense light; and an image sensor configured to receive light and output a signal corresponding to a received amount of the light. The image sensor includes: a pixel that includes a photoelectric conversion element configured to perform photoelectric conversion and outputs an electric signal; a reference signal output unit configured to output a reference signal having a variable level; an AD conversion unit that includes a comparator configured to compare the electric signal output from the pixel with the reference signal and performs analog-to-digital (AD) conversion of the electric signal by using a result of the comparison between the electric signal and the reference signal by the comparator; and an attenuation unit configured to attenuate the electric signal input to the comparator in accordance with an amplitude of the electric signal.

In the sensor, the driving method, and the electronic device according to the present technology, an electric signal input to a comparator configured to compare the electric signal with a reference signal having a variable level is attenuated in accordance with the amplitude of the electric signal in a case where analog-to-digital (AD) conversion of the electric signal is performed by using a result of the comparison between the electric signal and the reference signal by the comparator.

Note that the sensor may be an independent device or an internal block of one device.

Effects of the Invention

The present technology can improve the dynamic range and noise of AD conversion.

Note that the present technology is not necessarily limited to the above-described effect, and may achieve any effect described in the present disclosure.

MODE FOR CARRYING OUT THE INVENTION

<One Embodiment of Digital Camera to which the Present Technology is Applied>

Figure 1:
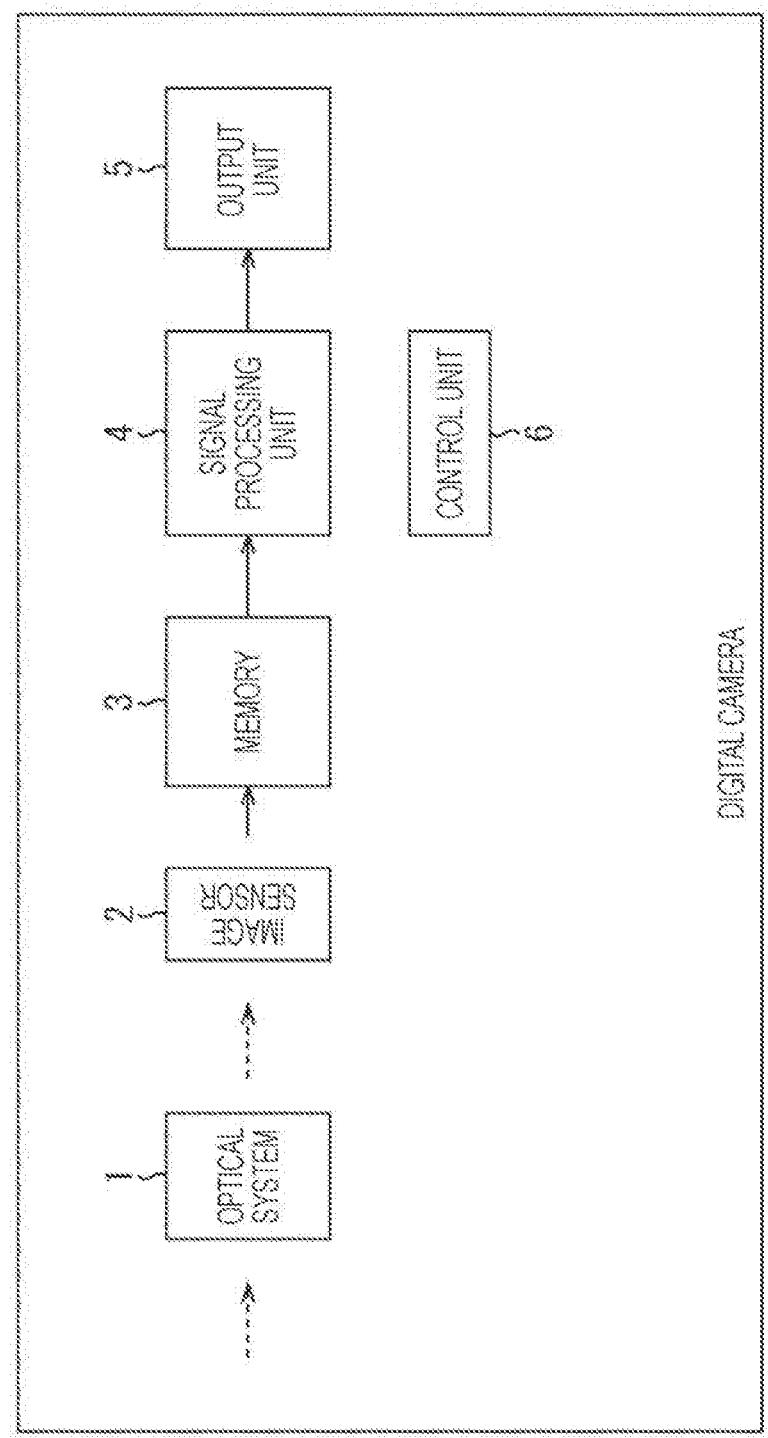
FIG. 1 is a block diagram illustrating an exemplary configuration of an embodiment of a digital camera to which the present technology is applied.

FIG. 1 is a block diagram illustrating an exemplary configuration of an embodiment of a digital camera to which the present technology is applied.

Note that the digital camera is capable of capturing any of a still image and a moving image.

In FIG. 1, the digital camera includes an optical system 1, an image sensor 2, a memory 3, a signal processing unit 4, an output unit 5, and a control unit 6.

The optical system 1 includes, for example, a zoom lens, a focus lens, an aperture, and the like (not illustrated), and causes external light to be incident on the image sensor 2.

The image sensor 2 is, for example, a complementary metal oxide semiconductor (CMOS) image sensor. The image sensor 2 receives the incident light from the optical system 1, and performs photoelectric conversion to output image data corresponding to the incident light from the optical system 1.

The memory 3 temporarily stores image data output from the image sensor 2.

The signal processing unit 4 performs signal processing on the image data stored in the memory 3, such as noise removal and white balance adjustment, and supplies the image data to the output unit 5.

The output unit 5 outputs the image data from the signal processing unit 4.

Specifically, the output unit 5 includes, for example, a display (not illustrated) including liquid crystal and the like, and displays an image corresponding to the image data from the signal processing unit 4 as what is called a through image.

In addition, the output unit 5 includes a driver (not illustrated) configured to drive a recording medium such as a semiconductor memory, a magnetic disk, or an optical disk, and records the image data from the signal processing unit 4 in the recording medium.

The control unit 6 controls each block of the digital camera in accordance with a user operation or the like.

In the digital camera configured as described above, the image sensor 2 receives incident light from the optical system 1, and outputs image data in accordance with the incident light.

The image data output from the image sensor 2 is supplied to and stored in the memory 3. The image data stored in the memory 3 is subjected to the signal processing by the signal processing unit 4, and image data obtained as a result is supplied to the output unit 5 and output.

<Exemplary configuration of image sensor 2>

Figure 2:
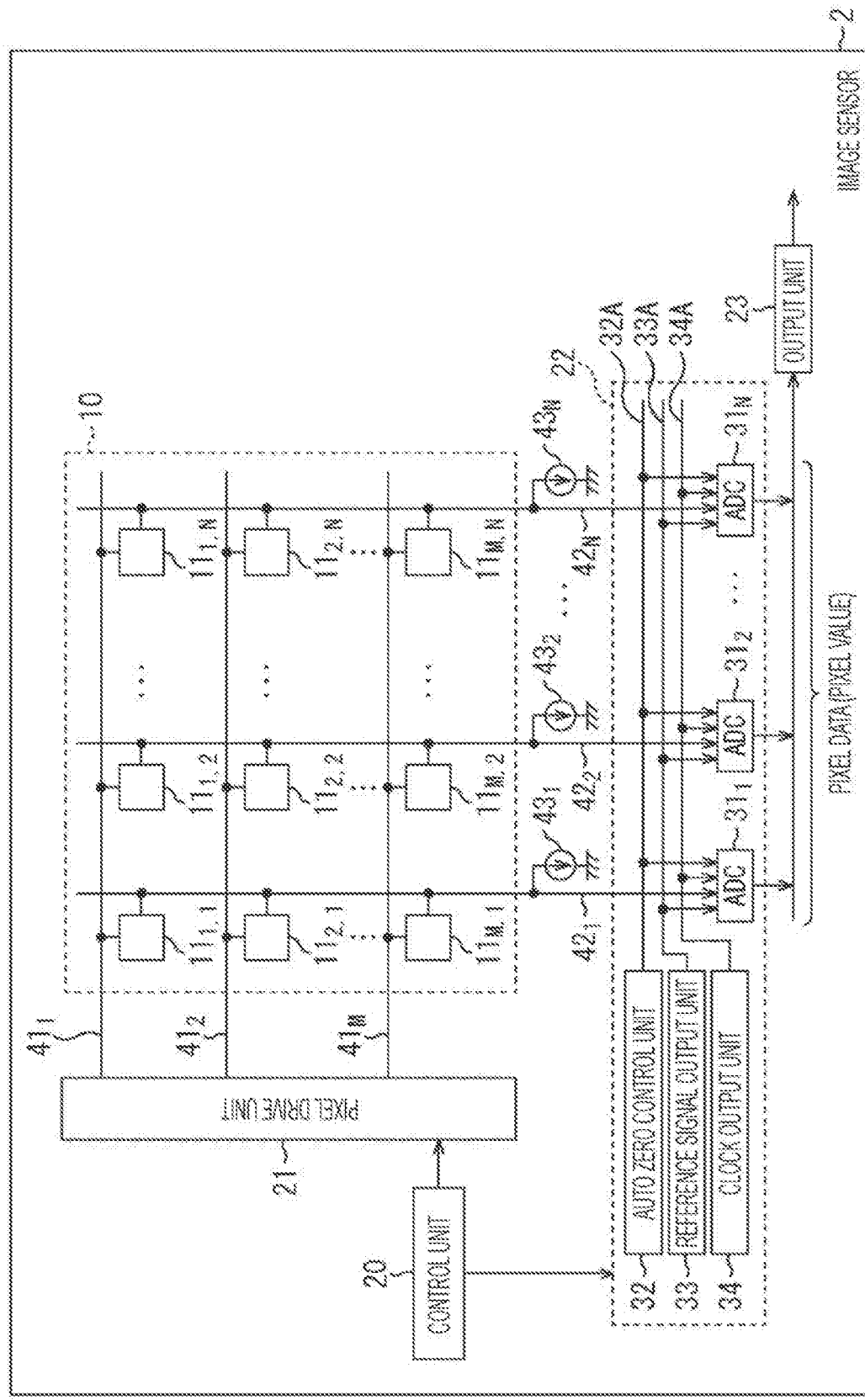
FIG. 2 is a block diagram illustrating an exemplary configuration of an image sensor 2.

FIG. 2 is a block diagram illustrating an exemplary configuration of the image sensor 2 in FIG. 1.

In FIG. 2, the image sensor 2 includes a pixel array 10, a control unit 20, a pixel drive unit 21, a line-parallel AD conversion device 22, and an output unit 23.

The pixel array 10 includes M×N (M and N are integers equal to or larger than one) pixels $11_{1,1}$, $11_{1,2}$, ..., $11_{1,N}$, $11_{2,1}$, $11_{2,2}$, ..., $11_{2,N}$, ..., $11_{M,1}$, $11_{M,2}$, ..., and $11_{M,N}$ configured to perform photoelectric conversion, and functions as an image capturing unit (imaging device) configured to capture an image.

The M×N pixels $11_{1,1}$ to $11_{M,N}$ are disposed in a matrix (lattice) of M rows and N columns on a two-dimensional plane.

The N pixels $11_{n,1}$ to $11_{m,N}$ arranged on the m-th row (m=1, 2, ..., M) (from top) in the row direction (lateral direction) in the pixel array 10 are connected with a pixel control line $41_m$ extending in the row direction.

In addition, the M pixels $11_{1,n}$ to $11_{M,n}$ arranged on the n-th column (n=1, 2, ..., N) (from left) in the column direction (longitudinal direction) are connected with a vertical signal line (VSL) $42_n$ extending in the column direction. The VSL $42_n$ is connected with a current source $43_n$ in addition to the pixels $11_{1,n}$ to $11_{M,n}$.

The pixel $11_{m,n}$ performs photoelectric conversion of light (incident light) incident on the pixel. Furthermore, in accordance with control by the pixel drive unit 21 through the pixel control line $41_n$, the pixel $11_{m,n}$ outputs, onto the VSL $42_n$, voltage (electric signal) corresponding to electric charge obtained through the photoelectric conversion.

Note that the pixel $11_{m,n}$ can perform photoelectric conversion of light having a predetermined color and incident through a color filter (not illustrated) in a Bayer array or the like.

The control unit 20 controls the pixel drive unit 21, the line-parallel AD conversion device 22 (an auto zero control unit 32, a reference signal output unit 33, and the like included therein), and any other necessary block in accordance with a predetermined logic or the like.

The pixel drive unit 21 controls (drives) the pixels $11_{m,1}$ to $11_{m,N}$ connected with the pixel control line $41_m$ in accordance with control by the control unit 20 through the pixel control line $41_m$.

The line-parallel AD conversion device 22 is connected with the pixels $11_{m,1}$ to $11_{m,N}$ arranged on each row through the VSLs $42_1$ to $42_N$, respectively. Thus, an electric signal (voltage) (hereinafter, also referred to as a VSL signal) output onto the VSL $42_n$ by the pixel $11_{m,n}$ is supplied to the line-parallel AD conversion device 22.

The line-parallel AD conversion device 22 performs, in parallel, AD conversion of the VSL signals supplied from the pixels $11_{m,1}$ to $11_{m,N}$, respectively, arranged on one row, through the VSLs $42_1$ to $42_N$. The line-parallel AD conversion device 22 supplies digital data obtained through the AD conversion as pixel values (pixel data) of the pixels $11_{m,1}$ to $11_{m,N}$ to the output unit 23.

The line-parallel AD conversion device 22 is capable of not only performing AD conversion of electric signals from all N pixels $11_{m,1}$ to $11_{m,N}$ arranged on one row in parallel, but also performing AD conversion of electric signals from pixels in a number equal to or larger than one and smaller than N among the N pixels $11_{n,1}$ to $11_{m,N}$ in parallel.

However, for simplification of description, the following assumes that the line-parallel AD conversion device 22 performs AD conversion of the VSL signals from all N pixels $11_{m,1}$ to $11_{m,N}$ arranged on one row in parallel.

The line-parallel AD conversion device 22 includes N analog to digital converters (ADC) $31_1$ to $31_N$ to perform AD conversion of the VSL signals from all N pixels $11_{n,1}$ to $11_{n,N}$ arranged on one row in parallel.

In addition, the line-parallel AD conversion device 22 includes the auto zero control unit 32, the reference signal output unit 33, and a clock output unit 34.

The auto zero control unit 32 supplies (outputs) an auto zero pulse (AZ pulse) as a signal for controlling auto zero processing at a comparator 73 included in the ADC $31_n$ as described later to the ADCs $31_1$ to $31_N$ through an auto zero control line 32A.

The reference signal output unit 33 includes, for example, a digital-to-analog converter (DAC), and supplies (outputs) a reference signal, such as a ramp signal, having a level (voltage) that changes from a predetermined initial value to a predetermined final value at a constant gradient in a duration, to the ADCs $31_1$ to $31_N$ through a reference signal line 33A.

The clock output unit 34 supplies (outputs) a clock at a predetermined frequency to the ADCs $31_1$ to $31_N$ through a clock line 34A.

The ADC $31_n$ is connected with the VSL $41_n$, and thus supplied with the VSL signal (electric signal) output onto the VSL $41_n$ from the pixel $11_{m,n}$.

The ADC $31_n$ performs AD conversion of the VSL signal output from the pixel $11_{m,n}$ by using the reference signal from the reference signal output unit 33 and the clock from the clock output unit 34, and further performs correlated double sampling (CDS) to obtain digital data as a pixel value.

The ADC $31_n$ performs AD conversion of the VSL signal from the pixel $11_{m,n}$ by comparing the VSL signal from the pixel $11_{m,n}$ with the reference signal from the reference signal output unit 33 and counting a time taken for changing the level of the reference signal until the level of the VSL signal from the pixel $11_{m,n}$ matches with the level of the reference signal (until the magnitude relation of the VSL signal and the reference signal is reversed).

The ADC $31_n$ counts the time taken for changing the level of the reference signal until the level of the VSL signal from the pixel $11_{m,n}$ matches with the level of the reference signal, by counting the clock from the clock output unit 34.

In addition, the VSL signals from the N pixels $11_{m,1}$ to $11_{m,N}$ on each of the first row to the M-th row of the pixel array 10 are supplied to the N ADCs $31_1$ to $31_N$, for example, sequentially from the first row, and AD conversion and CDS of the VSL signals are performed in the units of rows.

The output unit 23 selects the column n from which pixel values are to be read, reads, as a pixel value from the ADC $31_n$ of the column n, a result of AD conversion (and CDS) of the pixel $11_{m,n}$ obtained by the ADC $31_n$, and outputs the pixel value to the outside (in the present embodiment, the memory 3 (FIG. 1)).

Note that, in this example, the CDS is performed at the ADC $31_n$ in addition to the AD conversion; however, only the AD conversion may be performed at the ADC $31_n$, and the CDS may be performed at the output unit 23.

In addition, description of the CDS will be omitted in the following as appropriate.

<Exemplary Configuration of Pixel $11_{m,n}$>

Figure 3:
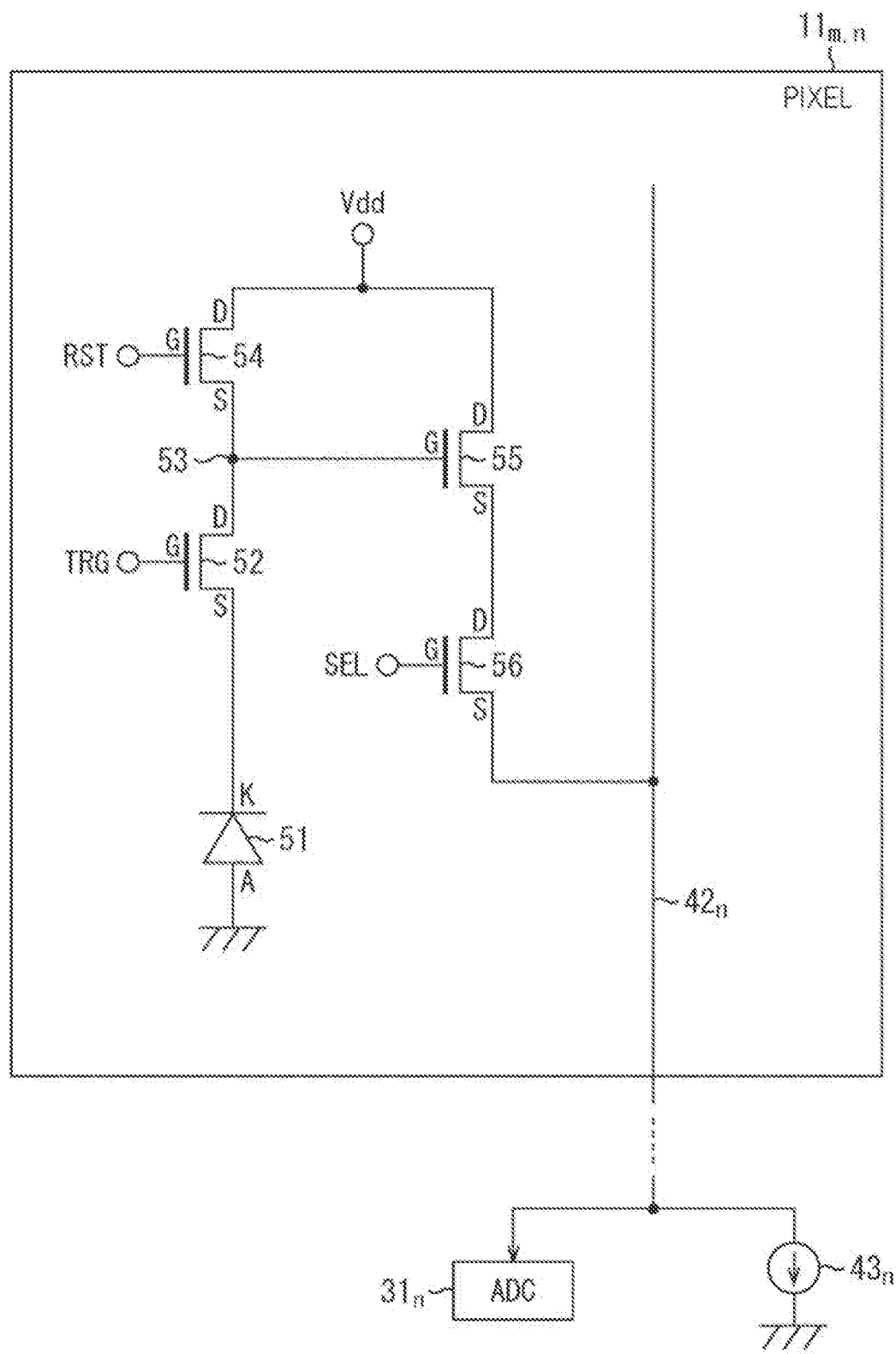
FIG. 3 is a circuit diagram illustrating an exemplary configuration of a pixel 11$m,n$.

FIG. 3 is a circuit diagram illustrating an exemplary configuration of the pixel $11_{n,n}$ in FIG. 2.

In FIG. 3, the pixel $11_{m,n}$ includes a photo diode (PD) 51 and four negative channel MOS (NMOS) field effect transistors (FET s) 52, 54, 55, and 56.

In addition, in the pixel $11_{m,n}$ the drain of the FET 52, the source of the FET 54, and the gate of the FET 55 are connected with each other so that a floating diffusion (FD) (capacitor) 53 configured to convert electric charge into voltage is formed at the connection point.

The PD 51 is an exemplary photoelectric conversion element configured to perform photoelectric conversion. The PD 51 receives incident light and performs the photoelectric conversion by charging electric charge corresponding to the incident light.

The PD 51 has an anode connected with the ground (grounded), and has a cathode connected with the source of the FET 52.

The FET 52 is an FET for transferring the electric charge charged at the PD 51 from the PD 51 to the FD 53, and is also referred to as a transfer Tr 52 in the following.

The transfer Tr 52 has a source connected with the cathode of the PD 51, and has a drain connected with the source of the FET 54 through the FD 53.

In addition, the gate of the transfer Tr 52 is connected with the pixel control line $41_n$, and supplied with a transfer pulse TRG through the pixel control line $41_m$.

Control signals transmitted through the pixel control line $41_m$ by the pixel drive unit 21 (FIG. 2) to drive (control) the pixel $11_{m,n}$ through the pixel control line $41_m$ include a reset pulse RST and a selection pulse SEL as described later in addition to the transfer pulse TRG.

The FD 53 is a region formed at the connection point among the drain of the transfer Tr 52, the source of the FET 54, and the gate of the FET 55 to convert electric charge into voltage like a capacitor.

The FET 54 is an FET for resetting electric charge (voltage (potential)) charged at the FD 53, and is also referred to as a reset Tr 54 in the following.

The reset Tr 54 has a drain connected with a power source Vdd.

In addition, the gate of the reset Tr 54 is connected with the pixel control line $41_n$, and supplied with the reset pulse RST through the pixel control line $41_m$.

The FET 55 is an FET for buffering the voltage of the FD 53, and is also referred to as an amplification Tr 55 in the following.

The amplification Tr 55 has a gate connected with the FD 53, and has a drain connected with the power source Vdd. In addition, the amplification Tr 55 has a source connected with the drain of the FET 56.

The FET 56 is an FET for selecting outputting of an electric signal (VSL signal) to the VSL $42_n$, and is also referred to as a selection Tr 56 in the following.

The selection Tr 56 has a source connected with the VSL $42_n$.

In addition, the gate of the selection Tr 56 is connected with the pixel control line $41_n$, and supplied with the selection pulse SEL through the pixel control line $41_m$.

Since the source of the amplification Tr 55 is connected with the current source $43_n$ through the selection Tr 56 and the VSL $42_n$, the amplification Tr 55 and the current source $43_n$ form (the circuit of) a source follower (SF), and thus the FD 53 is connected with the VSL $42_n$ through the SF.

Note that the pixel $11_{m,n}$ may include no selection Tr 56.

In addition, the pixel $11_{m,n}$ may employ a sharing pixel configuration in which the FD 53 to the selection Tr 56 are shared by a plurality of PDs 51 and transfer Trs 52.

In the pixel $11_{m,n}$ configured as described above, the PD 51 receives light incident on the pixel and performs photoelectric conversion, thereby starting charging of electric charge in accordance with the light quantity of the received incident light. Note that this example assumes, for simplification of description, that the selection pulse SEL is at a H level and the selection Tr 56 is on.

When a predetermined time (exposure time) has elapsed since the charging of electric charge at the PD 51 has been started, the pixel drive unit 21 (FIG. 2) temporarily sets the transfer pulse TRG (from a low (L) level) to a high (H) level.

When the transfer pulse TRG is temporarily set to the H level, the transfer Tr 52 is temporarily turned on.

When the transfer Tr 52 is turned on, electric charge charged at the PD 51 is transferred to the FD 53 through the transfer Tr 52 and charged therein.

The pixel drive unit 21 temporarily turns on the reset Tr 54 by temporarily setting the reset pulse RST to the H level before temporarily setting the transfer pulse TRG to the H level.

When the reset Tr 54 is turned on, the FD 53 is connected with the power source Vdd through the reset Tr 54 so that electric charge at the FD 53 is swept to the power source Vdd through the reset Tr 54, thereby performing resetting.

The pixel $11_{m,n}$ is reset when the FD 53 is connected with the power source Vdd and electric charge at the FD 53 is reset as described above.

After the resetting of electric charge at the FD 53, the pixel drive unit 21 temporarily sets the transfer pulse TRG to the H level as described above, and accordingly, the transfer Tr 52 is temporarily turned on.

When the transfer Tr 52 is turned on, electric charge charged at the PD 51 is transferred to the reset FD 53 through the transfer Tr 52 and charged therein.

The voltage (potential) corresponding to the electric charge charged at the FD 53 is output as a VSL signal onto the VSL $42_n$ through the amplification Tr 55 and the selection Tr 56.

The ADC $31_n$ (FIG. 2) connected with the VSL $42_n$ performs AD conversion of a reset level as a VSL signal right after the resetting of the pixel $11_{m,n}$.

In addition, the ADC $31_n$ performs AD conversion of a signal level (including the reset level and a level as a pixel value) as a VSL signal (voltage corresponding to electric charge charged at the PD 51 and transferred to the FD 53) after the transfer Tr 52 is temporarily turned on.

Then, the ADC $31_n$ performs the CDS to obtain, as a pixel value, the difference between a result (hereinafter, also referred to as a reset level AD value) of the AD conversion of the reset level and a result (hereinafter, also referred to as a signal level AD value) of the AD conversion of the signal level.

<Exemplary Configuration of ADC $31_n$>

Figure 4:
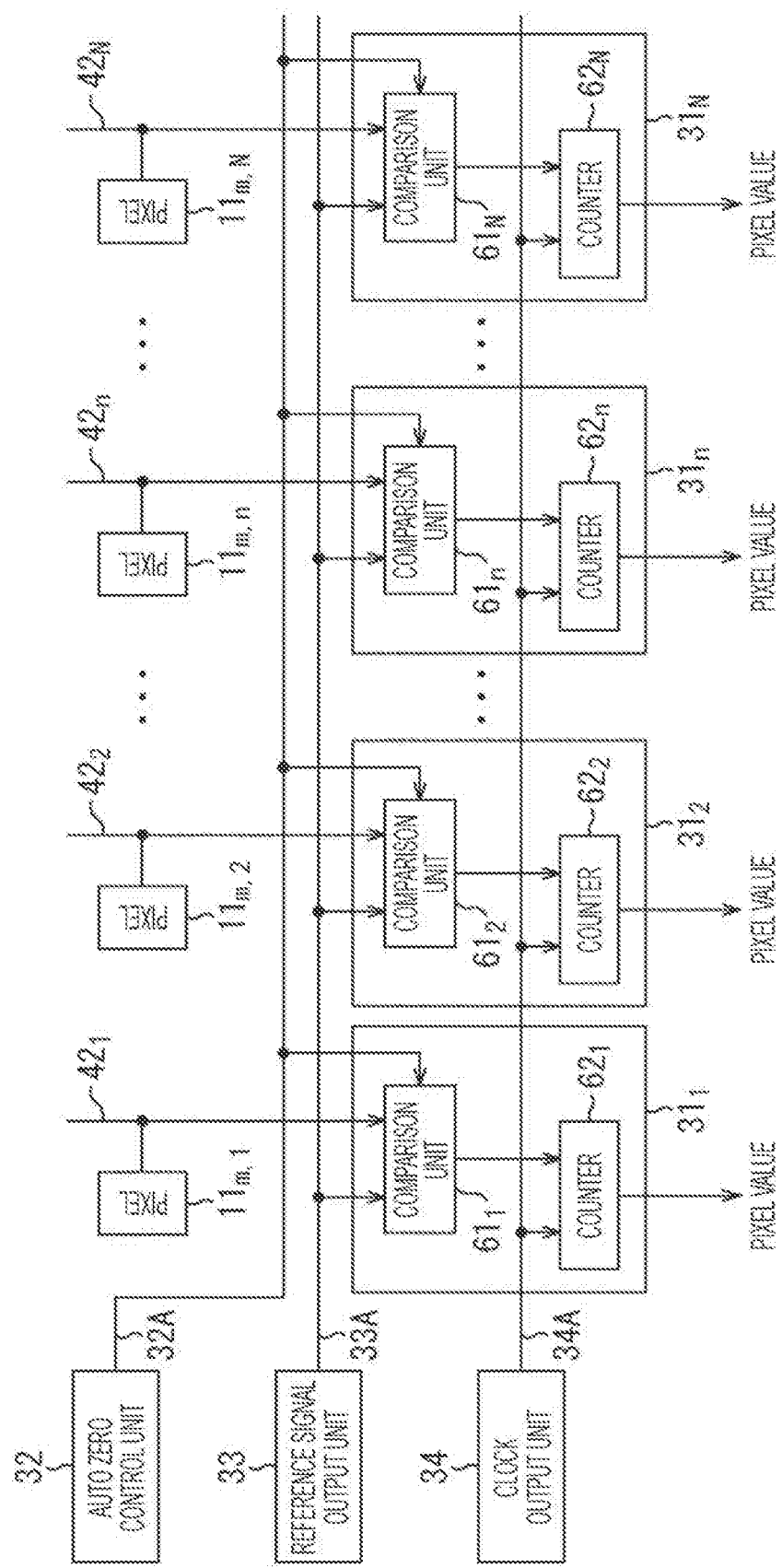
FIG. 4 is a block diagram illustrating an exemplary configuration of an ADC 31$n$.

FIG. 4 is a block diagram illustrating an exemplary configuration of the ADC $31_n$ in FIG. 2.

The ADC $31_n$ includes a comparison unit $61_n$ and a counter $62_n$, and performs the AD conversion of a reference signal comparison type and the CDS.

The comparison unit $61_n$ is supplied with the reference signal from the reference signal output unit 33, and the VSL signal from the pixel $11_{m,n}$ (the reset level, the signal level).

The comparison unit $61_n$ compares the reference signal and the VSL signal thus supplied, and outputs a result of the comparison.

Specifically, the comparison unit $61_n$ outputs one of the H and L levels, for example, the H level in a case where the reference signal is larger than the VSL signal.

In addition, the comparison unit $61_n$ outputs the L level as the other of the H and L levels in a case where the VSL signal is larger than the voltage of the reference signal.

Note that the comparison unit $61_n$ is supplied with the AZ pulse from the auto zero control unit 32 through the auto zero control line 32A. The comparison unit $61_n$ performs the auto zero processing in accordance with the AZ pulse from the auto zero control unit 32.

In the auto zero processing, the comparison unit $61_n$ is (initially) set to obtain such a comparison result that the reference signal and the VSL signal as two input signals currently provided to the comparison unit $61_n$ match with each other.

The counter $62_n$ is supplied with the output from the comparison unit $61_n$ and the clock from the clock output unit 34.

The counter $62_n$ starts counting the clock from the clock output unit 34, for example, at a timing when (the level of) the reference signal supplied from the reference signal output unit 33 to the comparison unit $61_n$ starts changing. The counter $62_n$ ends the counting of the clock from the clock output unit 34 when the output from the comparison unit $61_n$ changes, for example, from the H level to the L level, in other words, when the levels of the reference signal and the VSL signal supplied to the comparison unit $61_n$ become equal to each other (when the magnitude relation between the reference signal and the VSL signal is reversed).

Then, the counter $62_n$ outputs the clock count value as a result of the AD conversion of the VSL signal supplied to the comparison unit $61_n$.

The reference signal output from the reference signal output unit 33 is, for example, a signal having a slope (sloped waveform) along which voltage decreases at a constant ratio from a predetermined initial value to a predetermined final value.

In this case, the counter $62_n$ counts a time until the voltage of the reference signal becomes equal to the voltage of the VSL signal supplied to the comparison unit $61_n$ since the start of the slope, and outputs a count value obtained by the counting as the result of the AD conversion of the VSL signal supplied to the comparison unit $61_n$.

As described above, the ADC $31_n$ performs AD conversion of the VSL signal by using the result of the comparison between the reference signal and the VSL signal by the comparison unit $61_n$.

The ADC $31_n$ obtains results of AD conversion of the reset level as the VSL signal supplied from the pixel $11_{m,n}$ to the comparison unit $61_n$, and the signal level. Then, the ADC $31_n$ performs the CDS to obtain the difference between the result (signal level AD value) of the AD conversion of the signal level and the result (reset level AD value) of the AD conversion of the reset level, and outputs the difference obtained through the CDS as the pixel value of the pixel $11_{m,n}$.

Note that the ADC $31_n$ may perform the CDS by actually executing calculation to obtain the difference between the signal level AD value and the reset level AD value, or for example, by controlling the clock counting at the counter $62_n$.

Specifically, the CDS that obtains the difference between the signal level (result of the AD conversion thereof) and the reset level (result of the AD conversion thereof) may be performed while the AD conversion of the reset level and the signal level is performed, for example, by counting the clock at the counter $62_n$ while decrementing the count value by one for the reset level or while incrementing the count value by one for the signal level, inversely to the case of the reset level, with the clock count value for the reset level as an initial value.

In addition, although, in the present embodiment, a ramp signal having a slope that decreases at a constant ratio is employed as the reference signal, another signal, for example, a ramp signal having a slope that increases at a constant ratio, a signal having a level that non-linearly changes, or the like may be employed as the reference signal.

<First Exemplary Configuration of Comparison Unit $61_n$>

Figure 5:
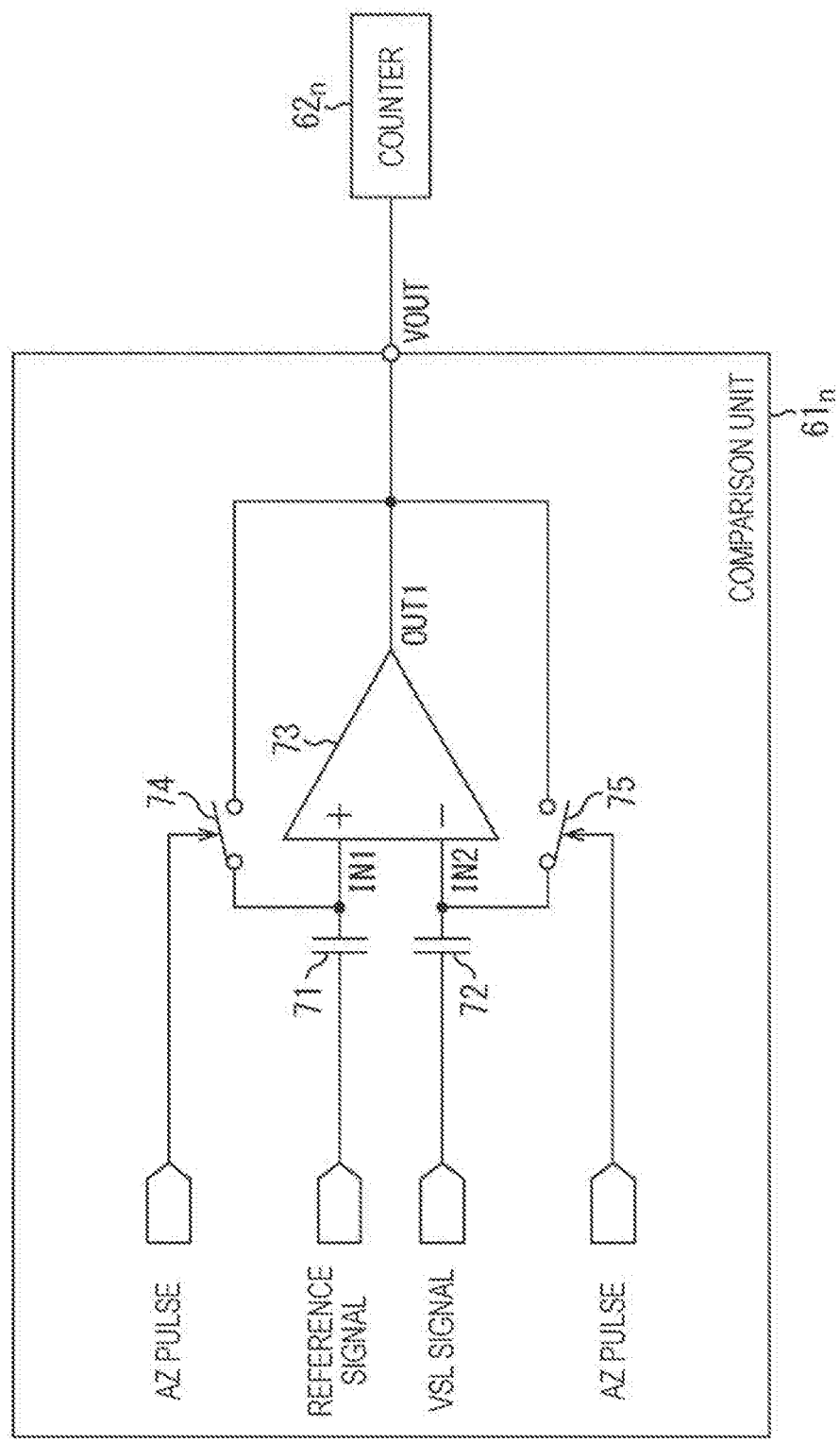
FIG. 5 is a diagram illustrating a first exemplary configuration of a comparison unit 61$n$.

FIG. 5 is a diagram illustrating a first exemplary configuration of the comparison unit $61_n$ in FIG. 4.

The comparison unit $61_n$ includes capacitors 71 and 72, the comparator 73, and switches 74 and 75.

The capacitor 71 is an auto zero processing capacitor having one end connected with a non-inverting input terminal (+) IN1 of the comparator 73 and the other end supplied with the reference signal. Thus, the reference signal is supplied to the non-inverting input terminal IN1 of the comparator 73 through the capacitor 71.

The capacitor 72 is an auto zero processing capacitor having one end connected with an inverting input terminal (−) IN2 of the comparator 73 and the other end supplied with the VSL signal. Thus, the VSL signal is supplied to the inverting input terminal IN2 of the comparator 73 through the capacitor 72.

The comparator 73 includes the non-inverting input terminal IN1, the inverting input terminal IN2, and an output terminal OUT1.

The comparator 73 compares the reference signal input (supplied) to the non-inverting input terminal IN1 through the capacitor 71 and the VSL signal input to the inverting input terminal IN2 through the capacitor 72, and outputs a result VOUT of the comparison to the counter $62_n$ through the output terminal OUT1.

Specifically, the comparator 73 outputs one of the H and L levels, for example, the H level as the comparison result VOUT through the output terminal OUT1 in a case where the reference signal input to the non-inverting input terminal IN1 is larger than the VSL signal input to the inverting input terminal IN2.

In addition, the comparator 73 outputs the L level, which is the other of the H and L levels, as the comparison result VOUT through the output terminal OUT1 in a case where the VSL signal input to the inverting input terminal IN2 is larger than the voltage of the reference signal input to the non-inverting input terminal IN1.

The switches 74 and 75 are turned on or off in accordance with the AZ pulse supplied from the auto zero control unit 32 through the auto zero control line 32A. When turned on or off, the switch 74 turns on or off connection between the non-inverting input terminal IN1 and the output terminal OUT1 of the comparator 73. When turned on or off, the switch 75 turns on or off connection between the inverting input terminal IN2 and the output terminal OUT1 of the comparator 73.

When the switches 74 and 75 are turned on and off, the auto zero processing is performed at the comparison unit $61_n$.

In the auto zero processing, the output terminal OUT1 of the comparator 73 is temporarily connected with each of the non-inverting input terminal IN1 and the inverting input terminal IN2 so that the capacitors 71 and 72 are charged and direct current (DC) levels of the non-inverting input terminal IN1 and the inverting input terminal IN2 become equal to each other to obtain such a comparison result that a signal currently supplied to the non-inverting input terminal IN1 of the comparator 73 matches with a signal currently supplied to the inverting input terminal IN2.

Through the auto zero processing, the magnitude relation between voltage provided to the non-inverting input terminal IN1 and voltage provided to the inverting input terminal IN2 can be determined by using, as a reference, a state in which the voltage provided to the non-inverting input terminal IN1 of the comparator 73 matches with the voltage provided to the inverting input terminal IN2 of the comparator 73 in the auto zero processing.

<Operation of Image Sensor 2>

Figure 6:
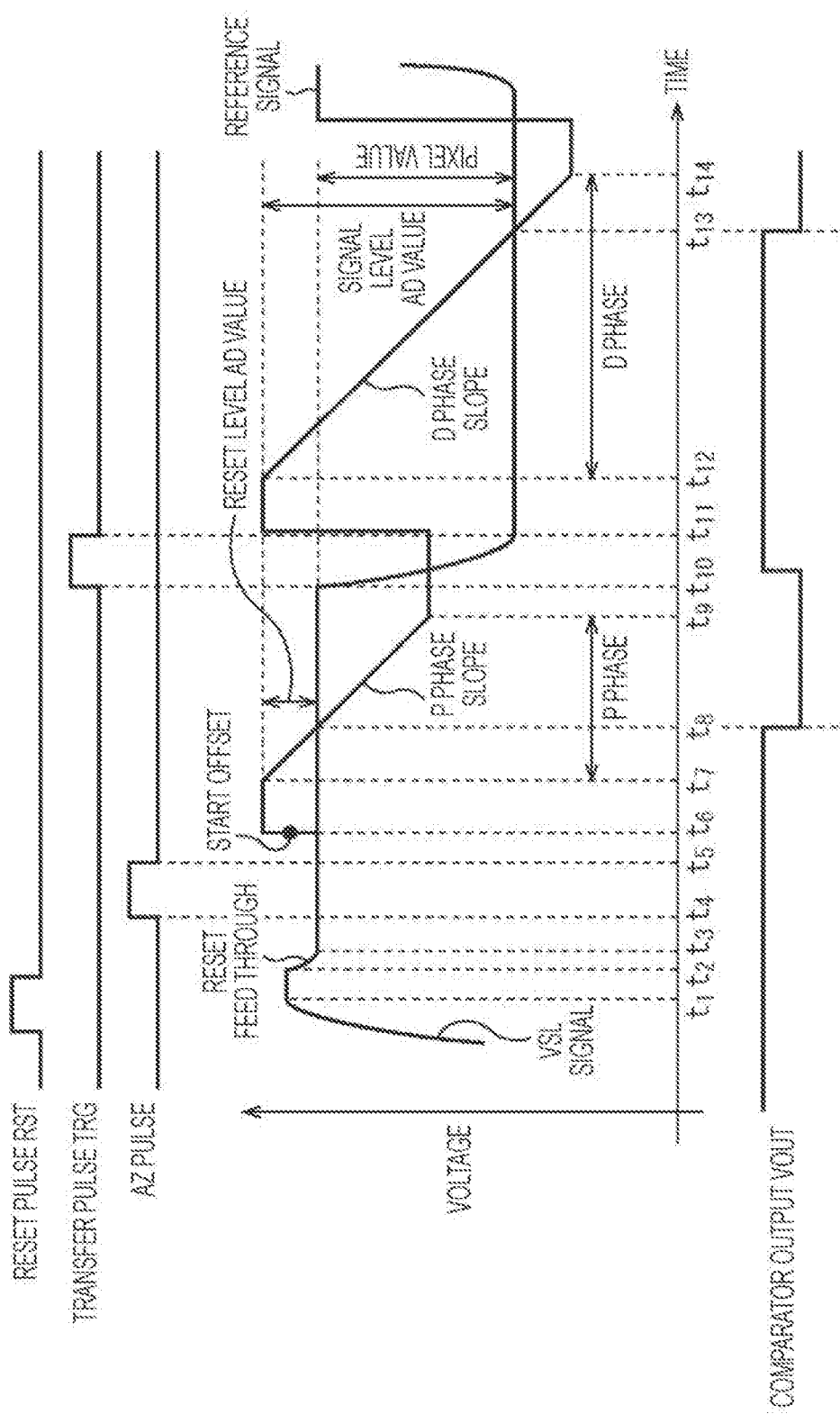
FIG. 6 is a diagram for describing operation of the image sensor 2.

FIG. 6 is a diagram for describing operation of the image sensor 2 (FIG. 2).

Note that, in FIG. 6, the horizontal axis represents time, and the vertical axis represents voltage.

FIG. 6 is a waveform diagram illustrating (the voltage of) an exemplary reference signal supplied from the reference signal output unit 32 to the non-inverting input terminal IN1 of the comparison unit $61_n$ of the ADC $31_n$ through the reference signal line 33A, and (the voltage of) an exemplary VSL signal as an electric signal supplied from the pixel $11_{m,n}$ to the inverting input terminal IN2 of the comparator 73 included in the comparison unit $61_n$ of the ADC $31_n$ through the VSL $42_n$ in the image sensor 2.

Note that FIG. 6 illustrates, in addition to the VSL signal and the reference signal, the transfer pulse TRG provided to (the gate of) the transfer Tr 52 (FIG. 3), the reset pulse RST provided to the reset Tr 54, the AZ pulse provided from the auto zero control unit 32 to the comparison unit $61_n$ (FIG. 5), and the comparison result (hereinafter also referred to as a comparator output) VOUT from the output terminal OUT1 of the comparator 73 (FIG. 5).

In addition, in FIG. 6, the reference signal indicates the voltage applied to the non-inverting input terminal IN1 of the comparator 73 (not the voltage on the reference signal line 34A), and the VSL signal indicates the voltage applied to the inverting input terminal IN2 of the comparator 73 (FIG. 6) (not the voltage on the VSL $42_n$).

At the image sensor 2, the reset pulse RST is temporarily set to the H level, and accordingly, the pixel $11_{m,n}$ is reset.

In the resetting of the pixel $11_{m,n}$ since the FD 53 is connected with the power source Vdd through the reset Tr 54 so that electric charge at the FD 53 is reset as described with reference to FIG. 3, the voltage of the VSL signal output from the pixel $11_{m,n}$, which is the VSL signal on the VSL $42_n$, output from the FD 53 through the amplification Tr 55 and the selection Tr 56 at the pixel $11_{m,n}$, increases to a voltage corresponding to the power source Vdd at time $t_1$.

The VSL signal maintains the voltage corresponding to the power source Vdd while the FD 53 is connected with the power source Vdd. Thereafter, when the reset pulse RST reaches the L level at time $t_2$, a small amount of electric charge enters into the FD 53 due to slight movement of electric charge in the pixel $11_{m,n}$ and as a result, the VSL signal slightly decreases.

In FIG. 6, from time $t_2$, at which the reset pulse RST reaches the L level, to time $t_3$, the VSL signal slightly decreases due to movement of electric charge in the pixel $11_{m,n}$.

The decrease of the VSL signal after the resetting of the pixel $11_{m,n}$ as described above is called reset feed through.

After the resetting of the pixel $11_{m,n}$ (or in the resetting), the AZ pulse is changed from the L level to the H level at the auto zero control unit 32, and accordingly, the auto zero processing is started at the comparison unit $61_n$.

In FIG. 6, at time $t_4$ after the reset feed through has occurred, the AZ pulse is changed from the L level to the H level, and the auto zero processing is started at the comparison unit 61n. Thereafter, at time $t_5$, the AZ pulse is changed from the H level to the L level, which ends (completes) the auto zero processing at the comparison unit $61_n$.

Through the auto zero processing, the comparison unit $61_n$ is set so that the magnitude relation of the VSL signal and the reference signal can be determined (compared) by using, as a reference, a state in which the VSL signal and the reference signal provided to the comparison unit $61_n$ match with each other at time $t_5$ as the falling edge timing of the AZ pulse.

In FIG. 6, the auto zero processing is completed after the resetting of the pixel $11_{m,n}$.

In this case, the comparison unit $61_n$ is set so that the magnitude relation of the VSL signal and the reference signal can be determined by using, as a reference, a state in which voltage decreased, by the reset feed through, from the VSL signal during the resetting of the pixel $11_{m,n}$ matches with the reference signal.

As a result, (the waveform of) the reference signal is disposed at a position based on, as a reference, the voltage decreased, by the reset feed through, from the VSL signal during the resetting of the pixel $11_{m,n}$.

The reference signal output unit 33 (FIG. 4) increases the reference signal by a predetermined voltage at time $t_6$ after the auto zero processing is completed (ended).

Hereinafter, the increases of the reference signal by the predetermined voltage at time $t_6$ after the auto zero processing is ended is also referred to as start offset.

In addition, the reference signal output unit 33 changes the voltage of the reference signal (level) to decrease at a constant ratio for the AD conversion of the VSL signal as described above, and part of the reference signal at which the voltage of the reference signal decreases at the constant ratio is also referred to as a slope in the following.

At time $t_6$, the reference signal output unit 33 performs the start offset to offset the reference signal by a predetermined voltage in a direction opposite to the direction of the slope (direction in which the voltage of the reference signal changes).

Thereafter, the reference signal output unit 33 causes the voltage of the reference signal to become smaller (decrease) at a constant ratio in the certain duration from time $t_7$ to time $t_9$.

Thus, the reference signal forms a slope in the duration from time $t_7$ to time $t_9$.

The slope of the reference signal in the duration from time $t_7$ to time $t_9$ is a slope for AD conversion of the reset level of the VSL signal (the VSL signal right after the resetting of the pixel $11_{m,n}$ (the VSL signal after the pixel $11_{m,n}$ is reset and a voltage decrease has occurred due to the reset feed through)). Hereinafter, the duration of the slope (the duration from time $t_7$ to time $t_9$) is also referred to as a preset (P) phase. In addition, the slope in the P phase is also referred to as a P phase slope in the following.

Since, through the auto zero processing after the resetting of the pixel $11_{m,n}$, the comparison unit $61_n$ is set so that (the voltages) of the VSL signal and the reference signal match with each other in the auto zero processing, the voltage of the reference signal becomes larger than the voltage of the VSL signal (the reset level) through the start offset, in which the reference signal is increased by a predetermined voltage, at time $t_6$ after the auto zero processing is ended. Thus, at start time $t_7$ of the P phase, the comparator 73 of the comparison unit $61_n$ outputs such a comparison result that the reference signal is larger than the VSL signal.

Specifically, the comparator output VOUT of the comparator 73 reaches the H level.

The counter $62_n$ of the ADC $31_n$ (FIG. 4) starts clock counting at, for example, start time $t_7$ of the P phase slope.

In the P phase, (the voltage of) the reference signal decreases, and the reference signal matches with the VSL signal as the reset level, at time $t_8$ in the P phase in FIG. 6. Then, the magnitude relation of the reference signal and the VSL signal is reversed relative to the start of the P phase.

As a result, the comparator output VOUT of the comparator 73 of the comparison unit $61_n$ is reversed relative to the start of the P phase, and the comparator 73 of the comparison unit $61_n$ starts outputting such a comparison result that the VSL signal as the reset level is larger than the reference signal.

Specifically, the comparator output VOUT of the comparator 73 reaches the L level.

When the comparator output VOUT of the comparator 73, in other words, the comparison result output from the comparison unit $61_n$ is reversed, the counter $62_n$ of the ADC $31_n$ (FIG. 4) ends clock counting, and the count value of the counter $62_n$ at that time is obtained as the AD conversion result (reset level AD value) of the reset level.

After the P phase ends, at the image sensor 2, the transfer pulse TRG is changed from the L level to the H level in the duration from time $t_{10}$ to $t_{11}$, and as a result, at the pixel $11_{m,n}$ (FIG. 3), electric charge charged at the PD 51 through photoelectric conversion is transferred to the FD 53 through the transfer Tr 52 and charged.

Through the charging of electric charge from the PD 51 to the FD 53, the voltage of the VSL signal corresponding to the electric charge charged at the FD 53 decreases. Then, when the transfer pulse TRG changes from the H level to the L level at time $t_{11}$, the transfer of electric charge from the PD 51 to the FD 53 ends, and the VSL signal reaches the signal level (voltage) corresponding to the electric charge charged at the FD 53.

In addition, after the P phase ends, the reference signal output unit 33 (FIG. 4) increases the reference signal to, for example, a voltage same as that at the start of the P phase.

As described above, when the VSL signal reaches the voltage corresponding to the electric charge charged at the FD 53, or when the reference signal increases to the voltage same as that at the start of the P phase, the magnitude relation of the reference signal and the VSL signal is reversed again.

As a result, the comparator output VOUT of the comparator 73 reaches the H level.

After having increased the reference signal to the voltage same as that at the start of the P phase, the reference signal output unit 33 (FIG. 4) causes the voltage of the reference signal to become smaller (decrease) at, for example, a change ratio same as that in the case of the P phase in the certain duration from time $t_{12}$ to time $t_{14}$ (not necessarily need to be equal to the certain duration from time $t_7$ to time $t_9$).

Thus, the reference signal in the duration from time $t_{12}$ to time $t_{14}$ forms a slope, similarly to the reference signal in the duration from time $t_7$ to time $t_9$.

The slope of the reference signal in the duration from time $t_{12}$ to time $t_{14}$ is a slope for AD conversion of the signal level of the VSL signal (the VSL signal right after the transfer of electric charge from the PD 51 to the FD 53 at the pixel $11_{m,n}$ (FIG. 3)). Hereinafter, the duration of the slope (the duration from time $t_{12}$ to time $t_{14}$ is also referred to as a data (D) phase. In addition, the slope in the D phase is also referred to as a D phase slope in the following.

At start time $t_{12}$ of the D phase, the reference signal is larger than (the voltage of) the VSL signal, similarly to the case of start time $t_7$ of the P phase. Thus, at start time $t_{12}$ of the D phase, the comparator output VOUT of the comparator 73 is at the H level indicating that the reference signal is larger than the VSL signal.

The counter $62_n$ of the ADC $31_n$ (FIG. 4) starts clock counting at start time $t_{12}$ of the D phase slope.

In the D phase, (the voltage of) the reference signal decreases, and the reference signal matches with the VSL signal as the signal level, at time $t_{13}$ in the D phase in FIG. 6. Then, the magnitude relation of the reference signal and the VSL signal is reversed relative to that at the start of the D phase.

As a result, the comparator output VOUT of the comparison circuit 73 of the comparison unit $61_n$ is reversed relative to that at the start of the D phase, and reaches the L level indicating that the VSL signal as the signal level is larger than the reference signal.

When the comparator output VOUT is reversed and reaches the L level, the counter $62_n$ of the ADC $31_n$ (FIG. 4) ends clock counting. Then, the count value of the counter $62_n$ at that time is obtained as the AD conversion result (signal level AD value) of the signal level.

After the reset level AD value is obtained in the P phase and the signal level AD value is obtained in the D phase as described above, the image sensor 2 performs the CDS to calculate the difference between the reset level AD value and the signal level AD value, and the difference obtained through the CDS is output as a pixel value.

Incidentally, as the increase of the saturation charge amount of the pixel $11_{m,n}$ and the decrease of the power source voltage Vdd proceed, it becomes difficult for the dynamic range of the ADC $31_n$ to cover the VSL signal (pixel signal) corresponding to electric charge charged at the pixel $11_{m,n}$.

However, the dynamic range of the ADC $31_n$ can be expanded to cover the VSL signal so that the slope of the reference signal intersects with the VSL signal by setting a low analog gain to the ADC $31_n$, in other words, setting a large gradient to the slope of the reference signal.

However, the low analog gain leads to a large quantization step of the AD conversion at the ADC $31_n$ increases, in other words, degrades bit resolution, which degrades quantization noise at a dark part of an object having a large tone difference.

To avoid this, the present technology attenuates the VSL signal input to the comparator 73 in accordance with the amplitude of the VSL signal, thereby improving the dynamic range and noise of the AD conversion.

<Second Exemplary Configuration of Comparison Unit $61_n$>

Figure 7:
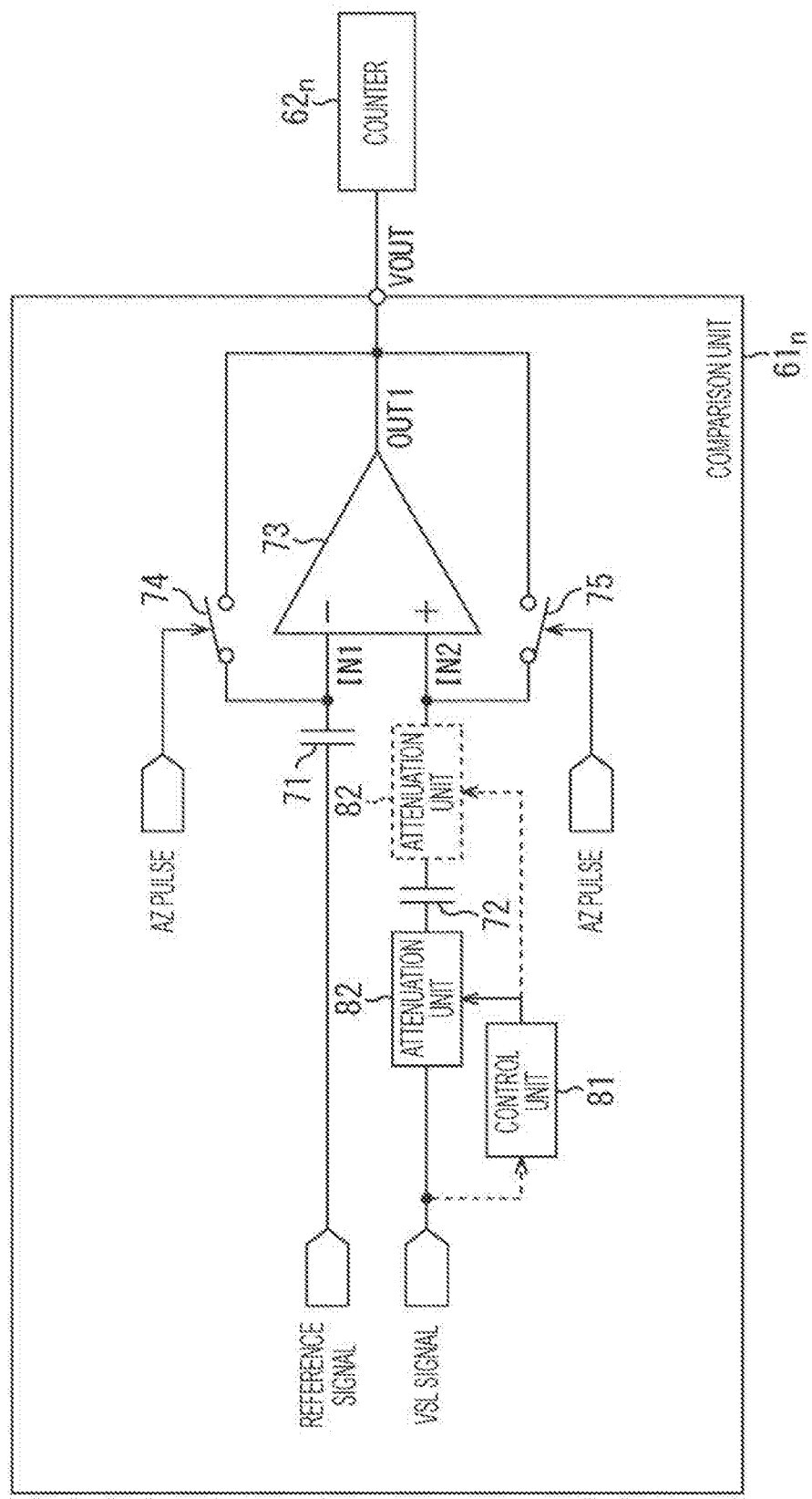
FIG. 7 is a diagram illustrating a second exemplary configuration of the comparison unit 61$n$.

FIG. 7 is a diagram illustrating a second exemplary configuration of the comparison unit $61_n$ in FIG. 4.

Note that any part in FIG. 7 corresponding to that in FIG. 5 is denoted by the same reference sign, and description thereof will be omitted as appropriate in the following.

In FIG. 7, the comparison unit $61_n$ includes the capacitors 71 and 72, the comparator 73, the switches 74 and 75, a control unit 81, and an attenuation unit 82.

Thus, the comparator $61_n$ in FIG. 7 is same as that in FIG. 5 in that the comparator includes the capacitor 71 to the switch 75.

However, the comparator $61_n$ in FIG. 7 is different from that in FIG. 5 in that the comparator newly includes the control unit 81 and the attenuation unit 82.

The control unit 81 controls the attenuation unit 82 in accordance with the amplitude of the VSL signal to attenuate the VSL signal input to the comparator 73.

The attenuation unit 82 is provided on, for example, a signal line through which the VSL signal is input to the comparator 73, and attenuates, in accordance with control by the control unit 81, the VSL signal input to the comparator 73.

Note that the attenuation of the VSL signal may be performed before the capacitor 72 through which the VSL signal is input to the inverting input terminal IN2 of the comparator 73 (on a side opposite to a side of the capacitor 72 connected with the comparator 73), or may be performed after the capacitor 72 (between the capacitor 72 and the comparator 73).

Specifically, the attenuation unit 82 may be provided before the capacitor 72 as illustrated with solid lines in FIG. 7, or may be provided after the capacitor 72 as illustrated with dotted lines in FIG. 7.

Figure 8:
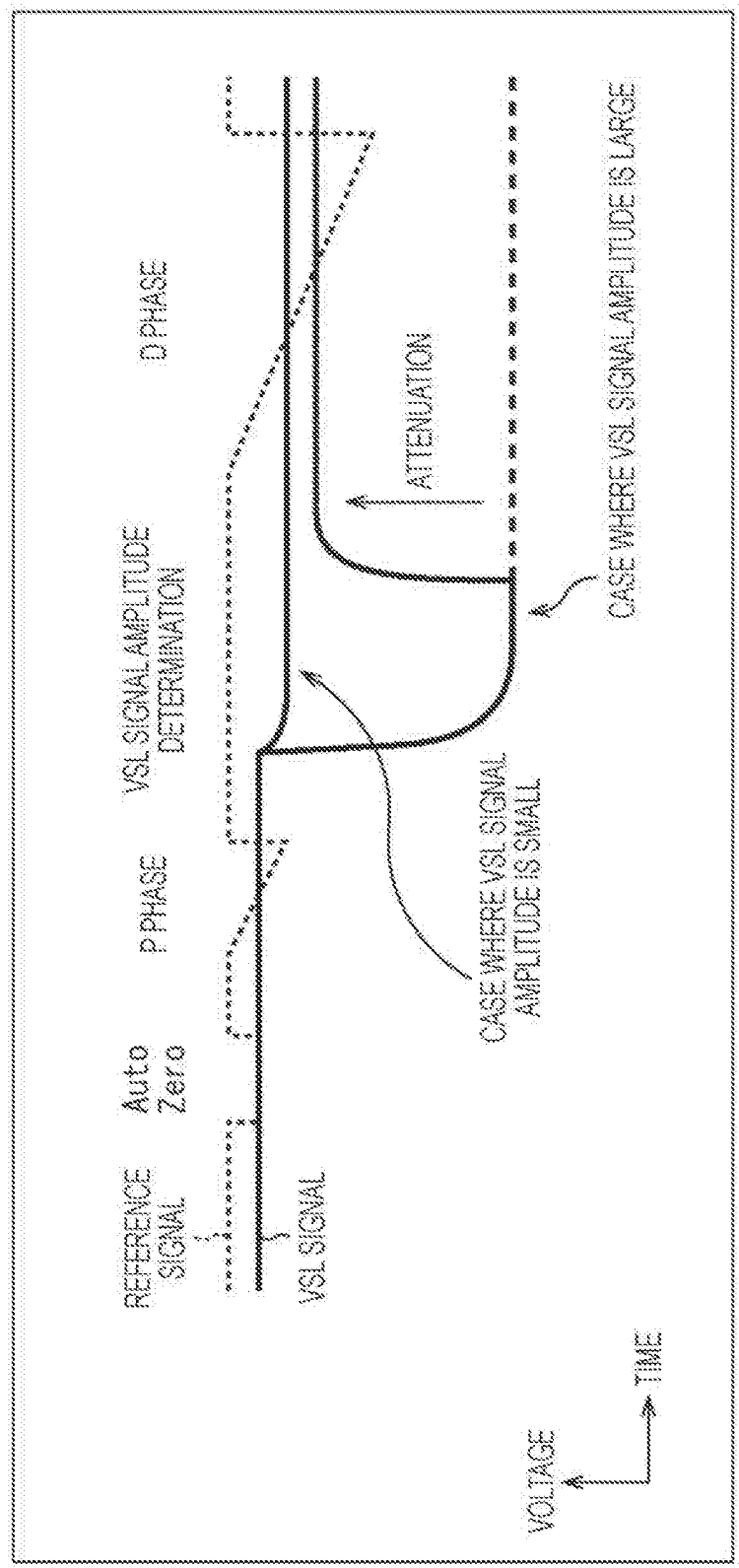
FIG. 8 is a timing chart for describing operation of a control unit 81 and an attenuation unit 82.

FIG. 8 is a timing chart for describing operation of the control unit 81 and the attenuation unit 82 in FIG. 7.

Specifically, FIG. 8 illustrates an exemplary reference signal and an exemplary VSL signal input to the non-inverting input terminal IN1 and the inverting input terminal IN2 of the comparator 73, respectively.

In a case where (the voltage of) the amplitude of the VSL signal is, for example, smaller than a predetermined threshold, the control unit 81 controls the attenuation unit 82 not to attenuate the VSL signal input to the comparator 73. In this case, the attenuation unit 82 directly outputs, in accordance with control by the control unit 81, the VSL signal input to the attenuation unit 82.

In a case where the amplitude of the VSL signal is larger than the predetermined threshold, the control unit 81 controls the attenuation unit 82 to attenuate the VSL signal input to the comparator 73. In this case, the attenuation unit 82 attenuates and outputs, in accordance with control by the control unit 81, the VSL signal input to the attenuation unit 82.

Since the attenuation unit 82 attenuates and outputs the VSL signal in a case where the amplitude of the VSL signal is larger than the predetermined threshold as described above, the amplitude of the VSL signal input to the comparator 73 becomes small.

As a result, the dynamic range of the ADC $31_n$ can cover the VSL signal without setting a low analog gain to the ADC $31_n$, in other words, without setting a large gradient to the slope of the reference signal.

This indicates that the dynamic range of the ADC $31_n$ is improved to a high dynamic range in effect because the dynamic range of the ADC $31_n$ can cover the VSL signal having a large amplitude.

In addition, since the high dynamic range of the ADC $31_n$ can be achieved without setting a low analog gain to the ADC $31_n$, it is possible to prevent quantization noise degradation at a dark part of an object having a large tone difference, which otherwise occurs when the quantization step of the AD conversion at the ADC $31_n$ becomes large as in a case where the high dynamic range of the ADC $31_n$ is achieved by setting a low analog gain to the ADC $31_n$.

Thus, the dynamic range and noise of the AD conversion can be improved.

In addition, the high dynamic range of the ADC $31_n$ achieved by attenuating the VSL signal can be achieved also when the power source voltage Vdd is low, which leads to low electric power consumption.

In addition, when the high dynamic range of the ADC $31_n$ is achieved by attenuating the VSL signal, it is possible to set a high analog gain to the ADC $31_n$, in other words, set a small gradient to the slope of the reference signal. The noise of the comparator 73 can be reduced by setting a high analog gain to the ADC $31_n$ as described above.

Note that, in a case where the AD conversion is performed after the VSL signal is attenuated, as a result of the AD conversion of the VSL signal, for example, the count value of the counter $62_n$ is multiplied by the attenuation amount, taking account of the attenuation amount of the VSL signal.

Figure 9:
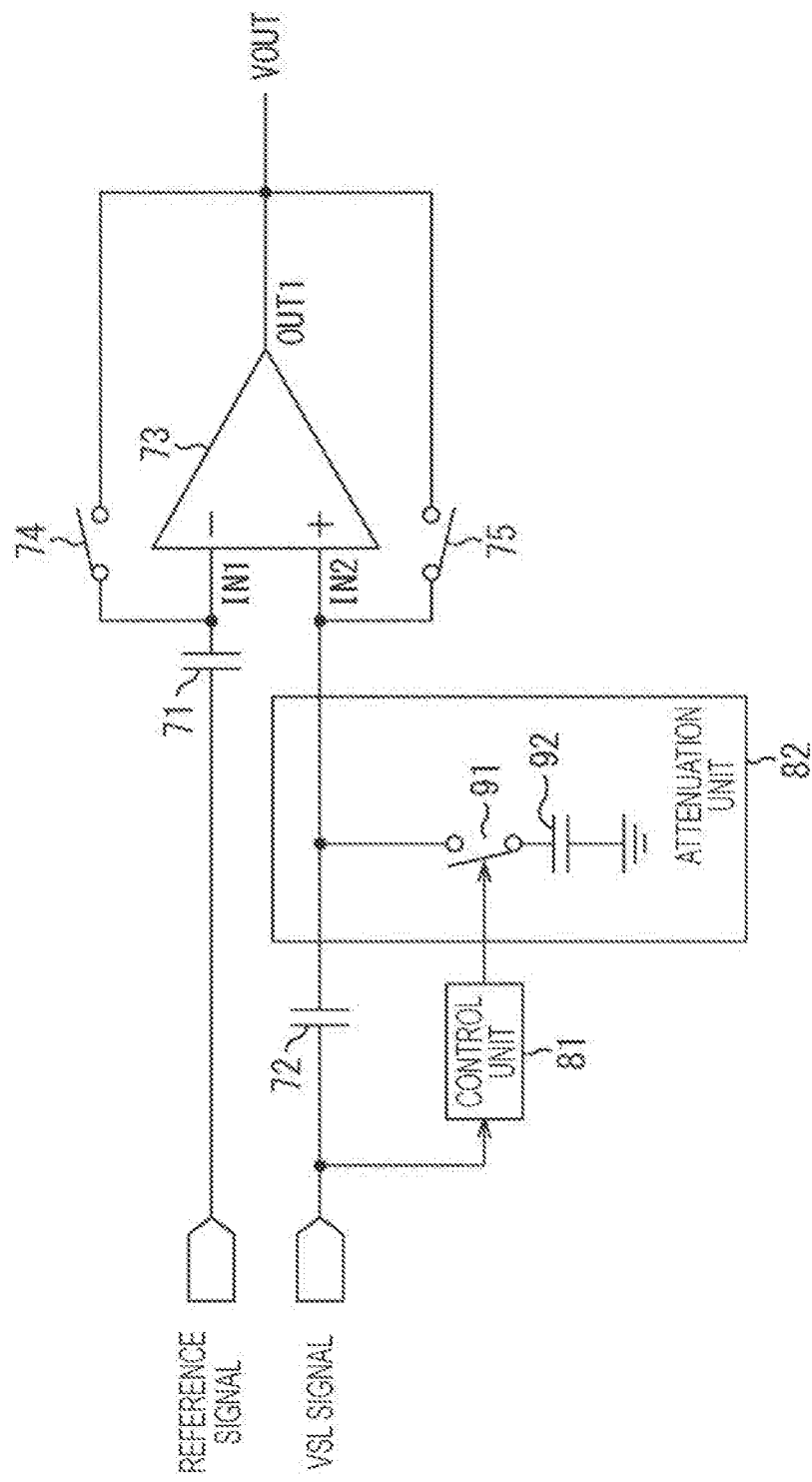
FIG. 9 is a diagram illustrating an exemplary configuration of the attenuation unit 82.

FIG. 9 is a diagram illustrating an exemplary configuration of the attenuation unit 82 in FIG. 7.

Specifically, FIG. 9 illustrates an exemplary configuration of the attenuation unit 82 provided after the capacitor 72.

In FIG. 9, the attenuation unit 82 includes a switch 91 and a capacitor 92.

The switch 91 turns on or off, in accordance with control by the control unit 81, connection between the capacitor 92 and the connection point between the capacitor 72 and the inverting input terminal IN2 of the comparator 73.

The capacitor 92 has one end connected with the switch 91 and the other end grounded.

In a case where the amplitude of the VSL signal is smaller than a predetermined threshold, the control unit 81 controls the switch 91 to turn off. In this case, the VSL signal is input to the inverting input terminal IN2 of the comparator 73 through the capacitor 72 without being attenuated at the attenuation unit 82.

In a case where the amplitude of the VSL signal is larger than the predetermined threshold, the control unit 81 controls the switch 91 to turn on. In this case, the VSL signal is attenuated through voltage division at the capacitors 72 and 92 and input to the inverting input terminal IN2 of the comparator 73.

Incidentally, in FIG. 7 (and FIG. 9), the control unit 81 performs amplitude determination as to whether the amplitude of the VSL signal is larger than the predetermined threshold by using the VSL signal; however, the amplitude determination may be performed by using the comparator output VOUT instead of using the very VSL signal itself.

The following describes an embodiment in which the amplitude determination of the VSL signal is performed by using the comparator output VOUT.

<Amplitude Determination of VSL Signal by Using Comparator Output VOUT>

Figure 10:
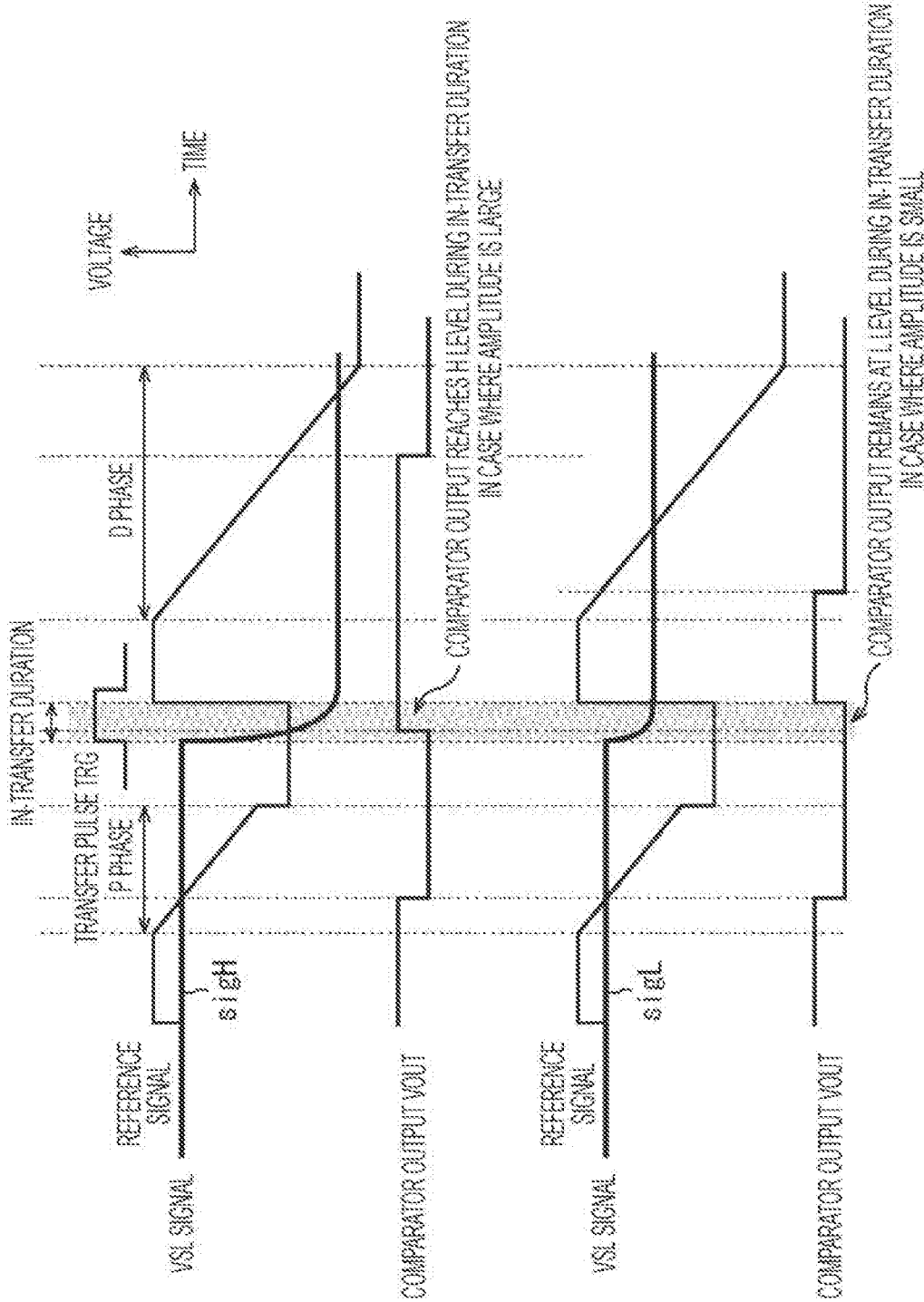
FIG. 10 is a timing chart for describing the principle of amplitude determination of a VSL signal by using a comparator output VOUT.

FIG. 10 is a timing chart for describing the principle of the amplitude determination of the VSL signal by using the comparator output VOUT.

Specifically, FIG. 10 illustrates an exemplary transfer pulse TRG, an exemplary reference signal, an exemplary VSL signal sigH having a large amplitude, an exemplary VSL signal sigL having a small amplitude, and an exemplary comparator output VOUT for each of the VSL signals sigH and sigL.

As described with reference to FIG. 6, the comparator output VOUT of the comparator 73 reaches the L level when the VSL signal as the reset level becomes larger than the reference signal in the P phase of the reference signal.

Then, after the P phase ends, the transfer pulse TRG is temporarily changed from the L level to the H level, and (the voltage of) the VSL signal decreases in accordance with electric charge charged at (the PD 51 of) the pixel $11_{m,n}$, and reaches the signal level (voltage) corresponding to the electric charge charged at the pixel $11_{m,n}$.

In addition, after the P phase ends, the reference signal output unit 33 (FIG. 4) increases the reference signal to a voltage same as that at the start of the P phase.

When the VSL signal reaches the voltage corresponding to the electric charge charged at the pixel $11_{m,n}$ and the reference signal is increased to a voltage same as that at the start of the P phase as described above, the reference signal becomes larger than the VSL signal, and the comparator output VOUT changes from the L level to the H level.

Thereafter, the D phase starts.

The duration from a timing when the transfer pulse TRG changes from the L level to the H level after the P phase ends to a timing when (right before) the reference signal is increased to a voltage same as that at the start of the P phase overlaps with the duration in which electric charge charged at the PD 51 is transferred to the FD 53 through the transfer Tr 52 at the pixel $11_{m,n}$ (FIG. 3). This duration is referred to as an in-transfer duration.

At (right before) the start of the in-transfer duration, the magnitude relation of the VSL signal and the reference signal, and the comparator output VOUT of the comparator 73 are similar to those at the end of the P phase. Specifically, at the start of the in-transfer duration, the VSL signal is larger than the reference signal, and the comparator output VOUT of the comparator 73 is at the L level.

In the in-transfer duration, while (the voltage of) the VSL signal decreases in accordance with the electric charge charged at the pixel $11_{m,n}$, the reference signal is yet to be increased to a voltage same as that at the start of the P phase. Thus, the VSL signal has a low voltage such as a voltage equal to or lower than a voltage at the end of the P phase.

Thus, in a case where the degree (amount) of the decrease of the VSL signal in the in-transfer duration is large, in other words, in a case where the amplitude of the VSL signal is larger than the predetermined threshold, the VSL signal is lower than the reference signal at the low voltage. As a result, in the in-transfer duration, the comparator output VOUT changes from the L level to the H level.

In a case where the degree of the decrease of the VSL signal in the in-transfer duration is small, in other words, in a case where the amplitude of the VSL signal is smaller than the predetermined threshold, the VSL signal is not lower than the reference signal at the low voltage. As a result, the comparator output VOUT remains at the L level in the in-transfer duration.

Thus, the amplitude determination as to whether the amplitude of the VSL signal is larger or smaller than the predetermined threshold can be performed in accordance with the comparator output VOUT in the transfer duration.

Specifically, in a case where the comparator output VOUT is inverted from the L level to the H level in the transfer duration, it can be determined that the amplitude of the VSL signal is larger than the predetermined threshold. In a case where the comparator output VOUT remains at the L level in the transfer duration, it can be determined that the amplitude of the VSL signal is smaller than the predetermined threshold.

As described above, the control unit 81 can perform the amplitude determination of the VSL signal by using the comparator output VOUT and control attenuation of the VSL signal at the attenuation unit 82 in accordance with (the magnitude of) the amplitude of the VSL signal obtained from a determination result of the amplitude determination.

Figure 11:
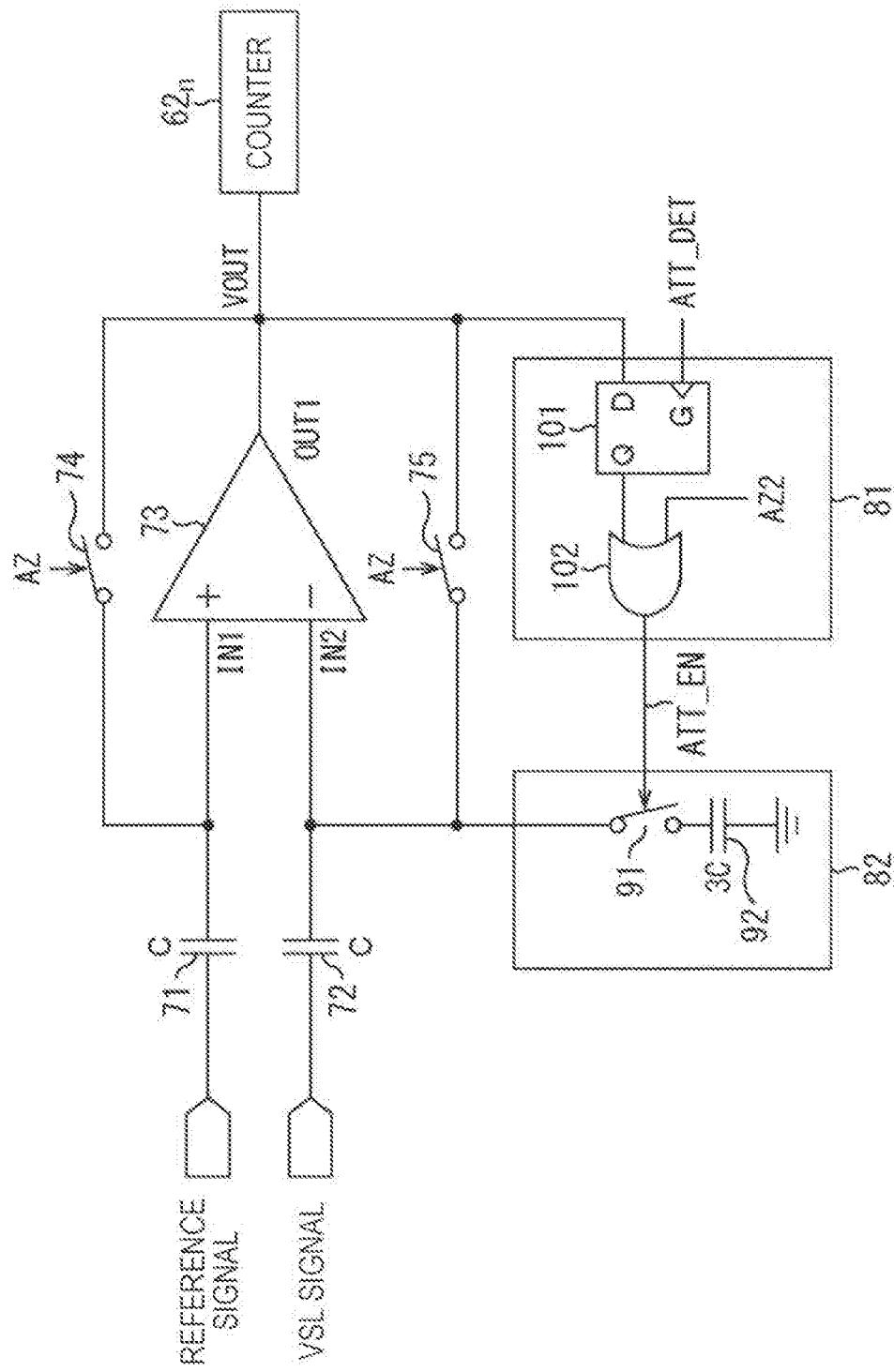
FIG. 11 is a circuit diagram illustrating a first exemplary configuration of the control unit 81 and the attenuation unit 82 in a case where the VSL signal is attenuated in accordance with a result of the amplitude determination by using the comparator output VOUT.

FIG. 11 is a circuit diagram illustrating a first exemplary configuration of the control unit 81 and the attenuation unit 82 in a case where the amplitude determination is performed by using the comparator output VOUT, and the attenuation of the VSL signal is performed in accordance with (the amplitude of the VSL signal obtained from) the result of the determination.

Note that any part in FIG. 11 corresponding to that in FIG. 9 is denoted by the same reference sign, and description thereof will be omitted as appropriate in the following.

In FIG. 11, the control unit 81 includes a D flip-flop 101 and an OR gate 102.

The D flip-flop 101 has an input terminal D connected with the output terminal OUT1 of the comparator 73 so that the comparator output VOUT is supplied to the input terminal D.

In addition, a signal ATT_DET is supplied to a clock terminal G of the D flip-flop 101.

The D flip-flop 101 latches the comparator output VOUT supplied to the input terminal D in accordance with the signal ATT_DET supplied to the clock terminal G, and outputs the comparator output VOUT through an output terminal Q.

The OR gate 102 is a two-input OR gate including two input terminals. One of the two input terminals of the OR gate 102 is connected with the output terminal Q of the D flip-flop 101, and the other input terminal is supplied with a pulse AZ2.

The OR gate 102 calculates and outputs a logical sum ATT_EN of the output from the output terminal Q of the D flip-flop 101 and the pulse AZ2.

The attenuation unit 82 includes the switch 91 and the capacitor 92. In other words, the attenuation unit 82 in FIG. 11 is configured similarly to the case illustrated in FIG. 9.

Note that, in FIG. 11, the switch 91 is turned on or off in accordance with the logical sum ATT_EN output from the OR gate 102. The switch 91 is turned on the logical sum ATT_EN in a case where the logical sum ATT_EN is at the H level, or the switch 91 is turned off in a case where the logical sum ATT_EN is at the L level.

In addition, in FIG. 11, the auto zero processing capacitors 71 and 72 have capacitance C, and the capacitor 92 has capacitance 3C.

In addition, the signal ATT_DET and the pulse AZ2 are supplied from, for example, the control unit 20 (FIG. 2).

Figure 12:
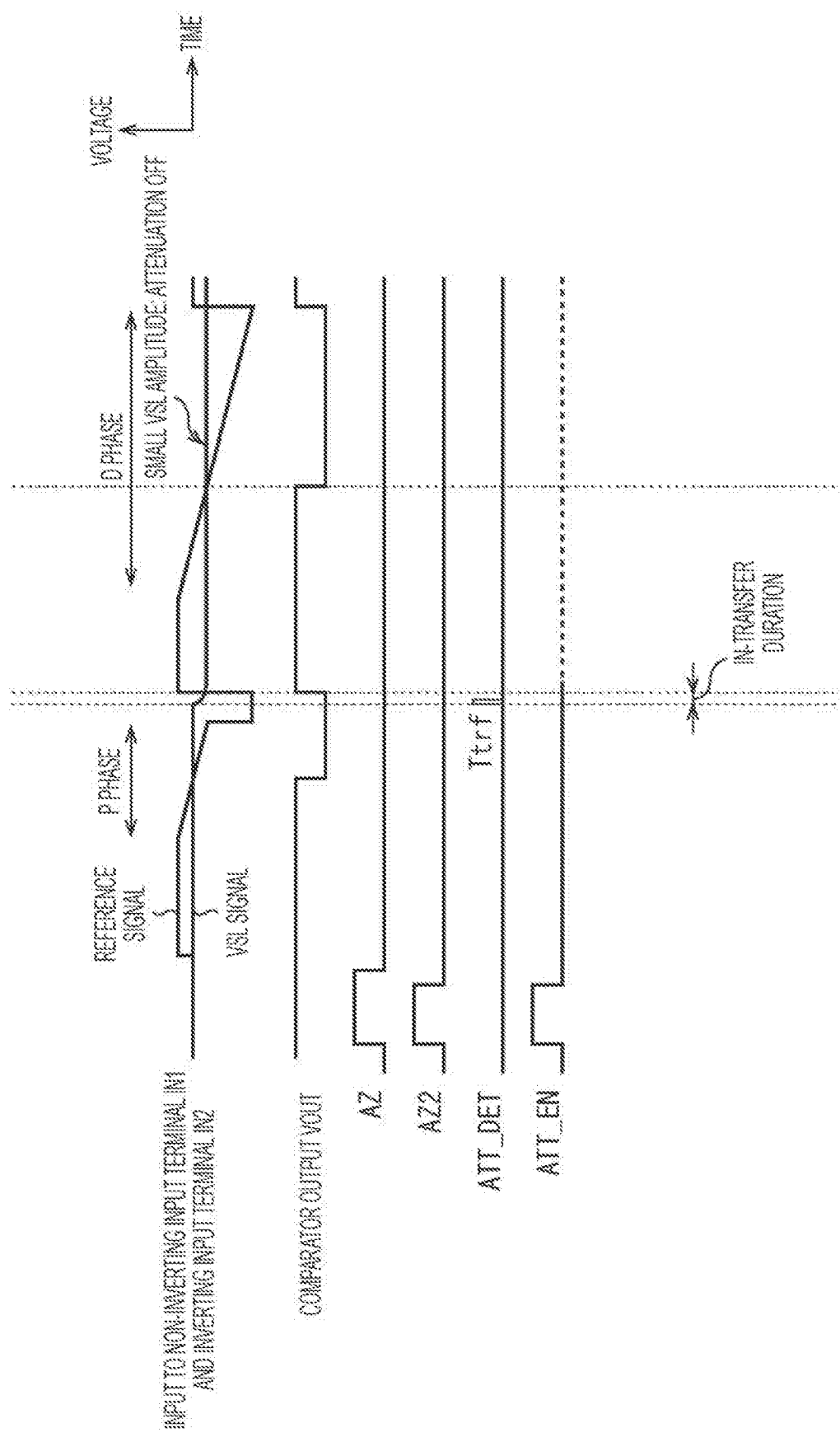
FIG. 12 is a timing chart for describing exemplary operation of the control unit 81 and the attenuation unit 82 in a case where the amplitude of the VSL signal is smaller than a predetermined threshold.

FIG. 12 is a timing chart for describing exemplary operation of the control unit 81 and the attenuation unit 82 in FIG. 11 in a case where the amplitude of the VSL signal is smaller than the predetermined threshold.

Specifically, FIG. 12 illustrates an exemplary reference signal, an exemplary VSL signal having a small amplitude, an exemplary comparator output VOUT, an exemplary AZ pulse, an exemplary pulse AZ2, an exemplary signal ATT_DET, and an exemplary logical sum ATT_EN.

The pulse AZ2 is at the H level in part of a duration in which the AZ pulse is at the H level, and the pulse AZ2 is at the L level in the other part of the duration.

In addition, the signal ATT_DET is at the H level in a duration Ttrf as part of the in-transfer duration, or the L level in the other part of the duration. Note that the duration (timing) in which the signal ATT_DET is at the H level is set in advance to include, for example, a timing at which the VSL signal decreases to some extent in accordance with the electric charge charged at the pixel $11_{m,n}$ in the in-transfer duration.

The pulse AZ2 is at the H level in part of the duration in which the AZ pulse is at the H level, and the logical sum ATT_EN output from the OR gate 102 to which the pulse AZ2 is supplied changes from the L level to the H level only in the duration in which the pulse AZ2 is at the H level.

The switch 91 being turned off is turned on in a duration in which the logical sum ATT_EN is at the H level, in other words, in the duration in which the pulse AZ2 is at the H level, and accordingly, the capacitor 92 in addition to the capacitors 71 and 72 are charged to obtain such a comparison result that a signal supplied to the non-inverting input terminal IN1 of the comparator 73 matches with a signal supplied to the inverting input terminal IN2 in a duration in which the auto zero processing is performed.

Thereafter, when the signal ATT_DET temporarily reaches the H level in the in-transfer duration, the D flip-flop 101 latches the current comparator output VOUT, and outputs the comparator output VOUT through the output terminal Q.

In FIG. 12, since the amplitude of the VSL signal is smaller than the predetermined threshold, the VSL signal does not become lower than the reference signal in the in-transfer duration, and the comparator output VOUT remains at the L level indicating that the VSL signal is larger than the reference signal.

As a result, the output of the D flip-flop 101 is (remains) at the L level, and the logical sum ATT_EN from the
OR gate 102 is (remains) at the L level.

Thus, in the attenuation unit 82, the switch 91 is turned (remains) off in accordance with the logical sum ATT_EN, and the VSL signal is input to the inverting input terminal IN2 of the comparator 73 without being attenuated.

Figure 13:
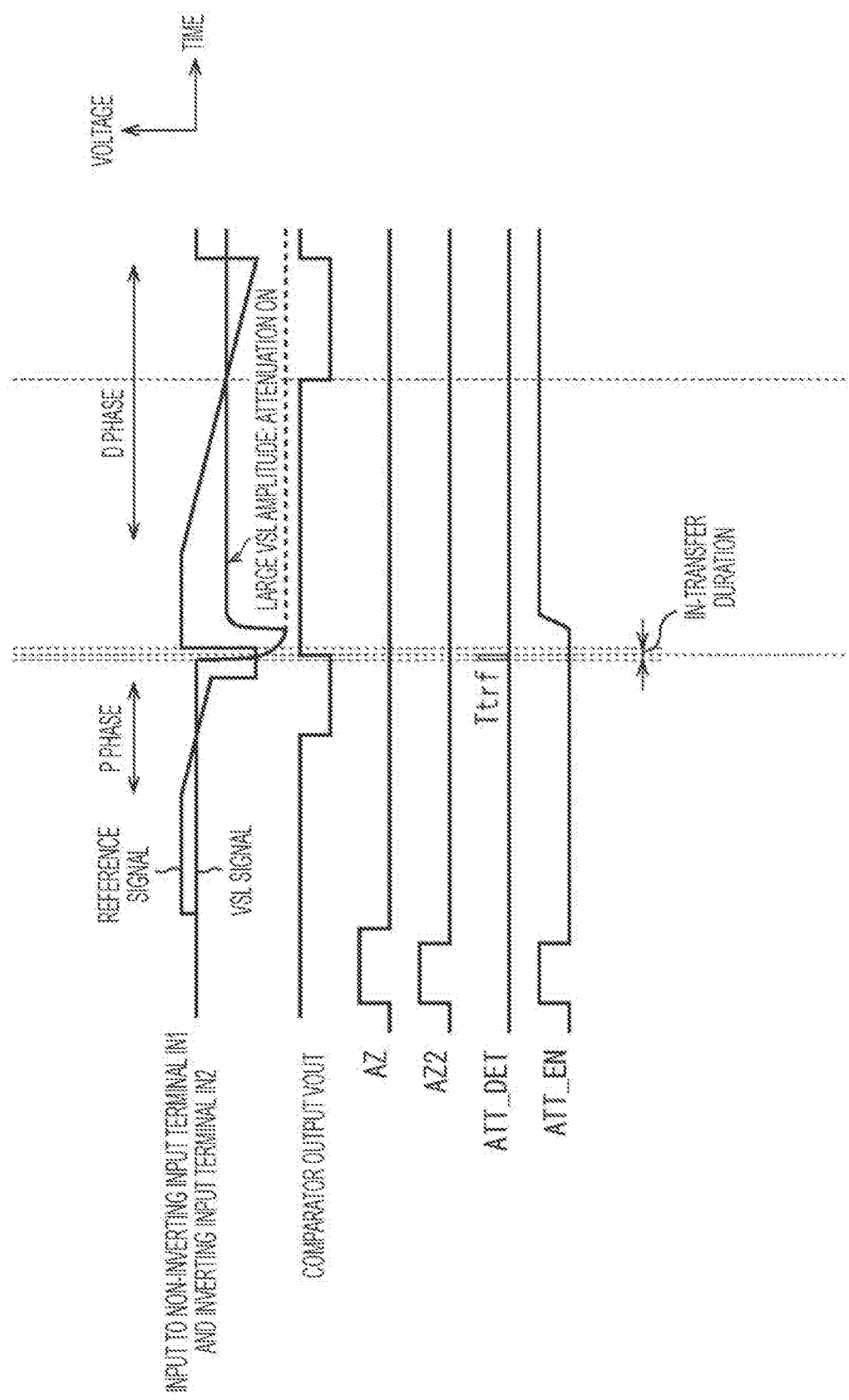
FIG. 13 is a timing chart for describing exemplary operation of the control unit 81 and the attenuation unit 82 in a case where the amplitude of the VSL signal is larger than the predetermined threshold.

FIG. 13 is a timing chart for describing exemplary operation of the control unit 81 and the attenuation unit 82 in FIG. 11 in a case where the amplitude of the VSL signal is larger than the predetermined threshold.

Specifically, FIG. 13 illustrates an exemplary reference signal, an exemplary VSL signal having a large amplitude, an exemplary comparator output VOUT, an exemplary AZ pulse, an exemplary pulse AZ2, an exemplary signal ATT_DET, and an exemplary logical sum ATT_EN.

Note that, in FIG. 13, the reference signal, the AZ pulse, the pulse AZ2, and the signal ATT_DET are similar to those in FIG. 12.

In FIG. 13, similarly to the case illustrated in FIG. 12, the capacitors 71 and 72 and the capacitor 92 are charged to obtain such a comparison result that a signal supplied to the non-inverting input terminal IN1 of the comparator 73 matches with a signal supplied to the inverting input terminal IN2 in the duration in which the auto zero processing is performed.

Then, when the signal ATT_DET temporarily reaches the H level in the in-transfer duration, the D flip-flop 101 latches the current comparator output VOUT, and outputs the comparator output VOUT through the output terminal Q.

In FIG. 13, since the amplitude of the VSL signal is larger than the predetermined threshold, the VSL signal becomes lower than the reference signal in the in-transfer duration, and the comparator output VOUT changes from the L level indicating that the VSL signal is larger than the reference signal to the H level indicating that the reference signal is larger than the VSL signal.

At the D flip-flop 101, the comparator output VOUT at the H level is latched in synchronization with the signal ATT_DET in the in-transfer duration. As a result, the output from the D flip-flop 101 changes from the L level to the H level, and the logical sum ATT_EN from the OR gate 102 changes from the L level to the H level.

Thus, at the attenuation unit 82, the switch 91 being off is turned on in accordance with the logical sum ATT_EN, and the VSL signal is attenuated through voltage division at the capacitors 72 and 92 and input to the inverting input terminal IN2 of the comparator 73.

Figure 14:
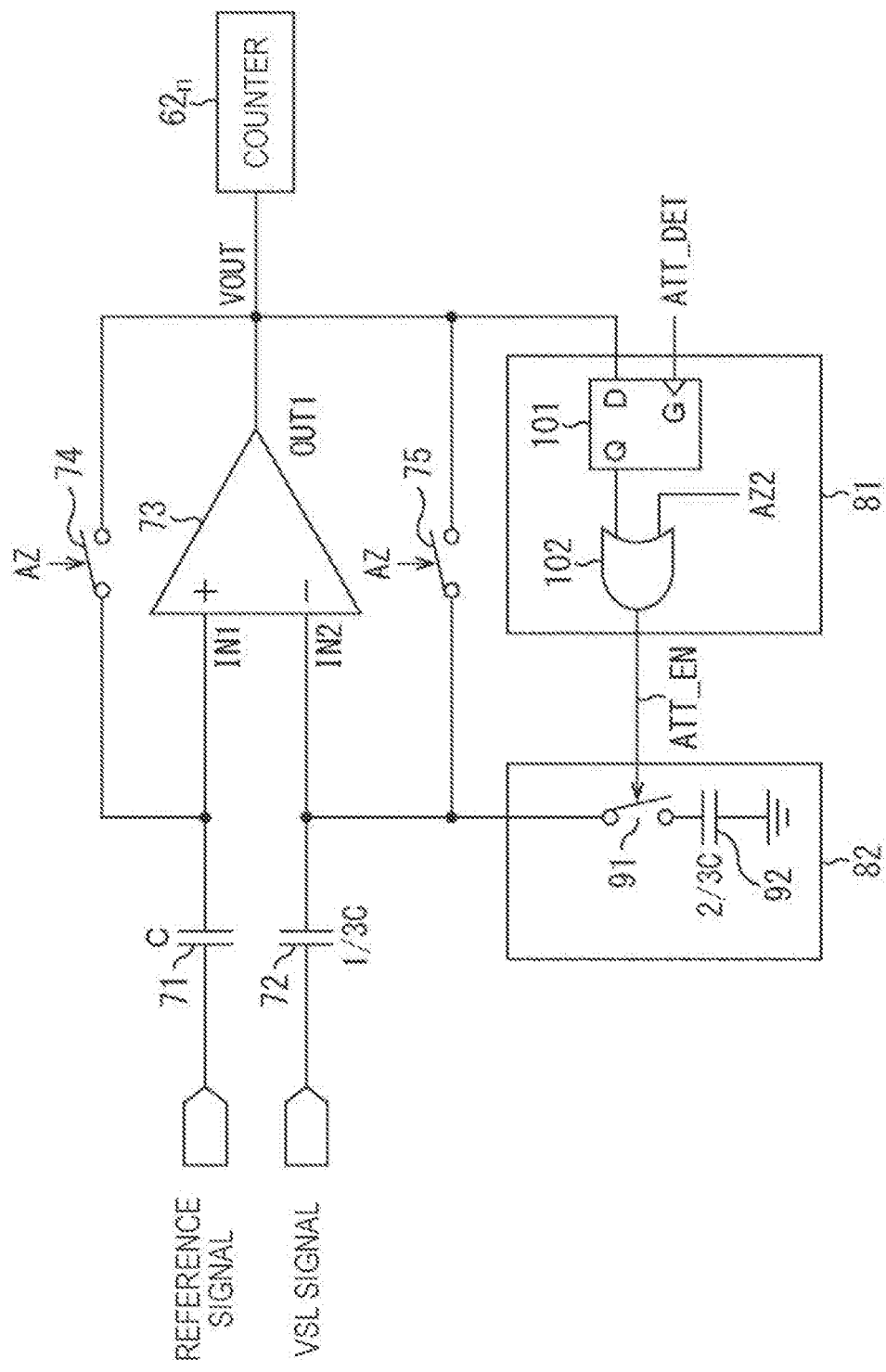
FIG. 14 is a circuit diagram illustrating a second exemplary configuration of the control unit 81 and the attenuation unit 82 in a case where the VSL signal is attenuated in accordance with the result of the amplitude determination by using the comparator output VOUT.

FIG. 14 is a circuit diagram illustrating a second exemplary configuration of the control unit 81 and the attenuation unit 82 in a case where the amplitude determination is performed by using the comparator output VOUT and the attenuation of the VSL signal is performed in accordance with a result of the determination.

Note that any part in FIG. 14 corresponding to that in FIG. 11 is denoted by the same reference sign, and description thereof will be omitted as appropriate in the following.

In FIG. 14, the control unit 81 and the attenuation unit 82 are configured similarly to the case illustrated in FIG. 11.

However, in FIG. 14, the auto zero processing capacitors 71 and 72 have capacitance C and capacitance ⅓ C, respectively, and the capacitor 92 has capacitance of ⅔ C.

In FIG. 11, the capacitor 92 included in the attenuation unit 82 has capacitance 3C, which is three times larger than those of the auto zero processing capacitors 71 and 72. The area of the capacitor 92 having capacitance 3C is large, and thus the image sensor 2 including the capacitor 92 potentially has a large size.

To avoid this, as illustrated in FIG. 14, the capacitor 72 may have capacitance ⅓ C, and the capacitor 92 may have capacitance ⅔ C.

In this case, size increase of the capacitor 92 and hence the image sensor 2 can be prevented.

Figure 15:
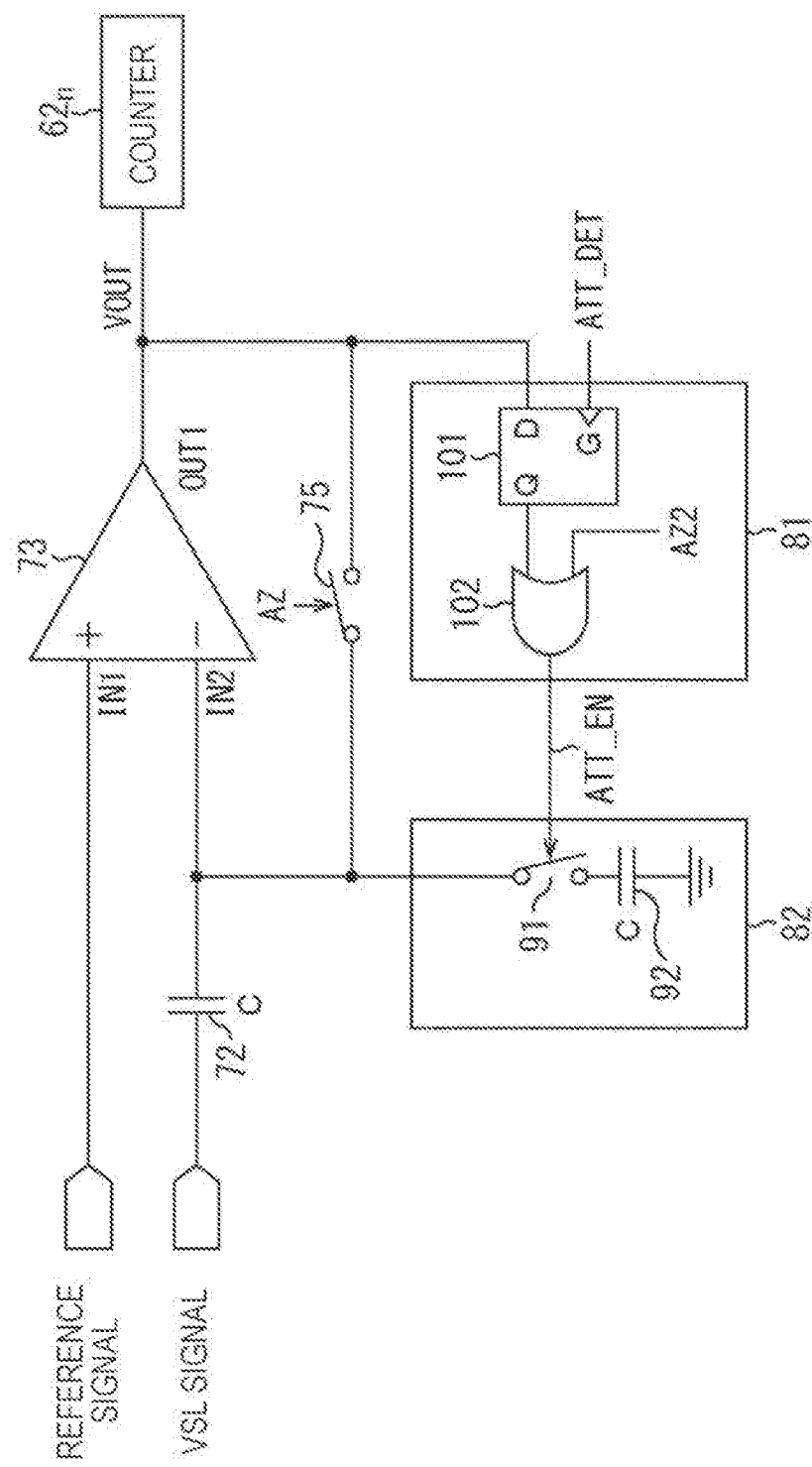
FIG. 15 is a circuit diagram illustrating a third exemplary configuration of the control unit 81 and the attenuation unit 82 in a case where the VSL signal is attenuated in accordance with the result of the amplitude determination by using the comparator output VOUT.

FIG. 15 is a circuit diagram illustrating a third exemplary configuration of the control unit 81 and the attenuation unit 82 in a case where the amplitude determination is performed by using the comparator output VOUT and the attenuation of the VSL signal is performed in accordance with a result of the determination.

Note that any part in FIG. 14 corresponding to that in FIG. 11 is denoted by the same reference sign, and description thereof will be omitted as appropriate in the following.

In FIG. 15, the control unit 81 and the attenuation unit 82 are configured similarly to the case illustrated in FIG. 11.

However, in FIG. 15, no auto zero processing capacitor 71 is provided, and the capacitor 92 has capacitance C.

In FIG. 15, the capacitor 92 can use an area occupied by the auto zero processing capacitor 71 in the image sensor 2, and thus size increase of the image sensor 2 can be prevented.

Note that, in FIG. 15, no auto zero processing capacitor 71 is provided on the non-inverting input terminal IN1 side, and thus no switch 74 is provided on the non-inverting input terminal IN1 side.

In addition, in FIG. 15, no auto zero processing capacitor 71 is provided on the non-inverting input terminal IN1 side, and thus the output of the comparator 73 needs to be adjusted so that the direct current (DC) level of the non-inverting input terminal IN1 becomes equal to the DC level of the inverting input terminal IN2.

Figure 16:
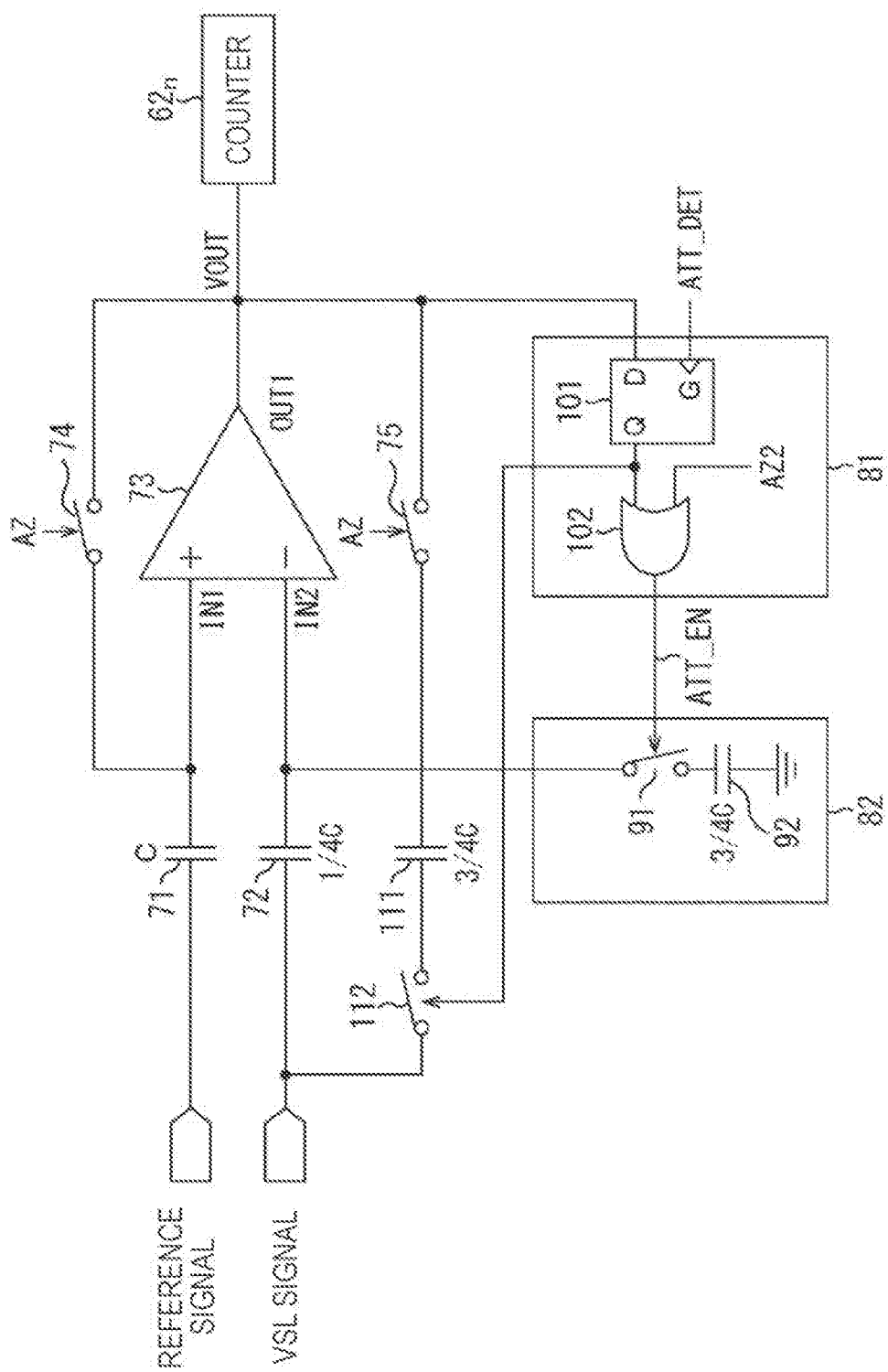
FIG. 16 is a circuit diagram illustrating a fourth exemplary configuration of the control unit 81 and the attenuation unit 82 in a case where the VSL signal is attenuated in accordance with the result of the amplitude determination by using the comparator output VOUT.

FIG. 16 is a circuit diagram illustrating a fourth exemplary configuration of the control unit 81 and the attenuation unit 82 in a case where the amplitude determination is performed by using the comparator output VOUT and the attenuation of the VSL signal is performed in accordance with a result of the determination.

Note that any part in FIG. 16 corresponding to that in FIG. 11 is denoted by the same reference sign, and description thereof will be omitted as appropriate in the following.

In FIG. 16, the control unit 81 and the attenuation unit 82 are configured similarly to the case illustrated in FIG. 11.

However, in FIG. 16, the auto zero processing capacitors 71 and 72 have capacitance C and capacitance ¼ C, respectively, and the capacitor 92 has capacitance ¾ C.

In addition, in FIG. 16, a capacitor 111 having capacitance ¾ C and a switch 112 are newly provided. Additionally, the switch 75, the capacitor 111, and the switch 112 are connected in series with each other to form a series circuit. Furthermore, the series circuit formed by the switch 75, the capacitor 111, and the switch 112 has one end connected with the output terminal OUT1 of the comparator 73 and the other end connected with a point before the capacitor 72 (with a side of the capacitor 72 opposite to a side connected with the comparator 73).

The switch 112 is turned on or off in accordance with the output of the D flip-flop 101. Specifically, the switch 112 is turned on in a case where the output of the D flip-flop 101 is at the H level. In addition, the switch 112 is turned off in a case where the output of the D flip-flop 101 is at the L level.

In FIG. 16, the control unit 81 and the attenuation unit 82 operate similarly to the case illustrated in FIG. 11.

In FIG. 16, similarly to, for example, the case of FIG. 14, size increase of the capacitor 92 and hence the image sensor 2 can be reduced as compared to the case illustrated in FIG. 11.

Figure 17:
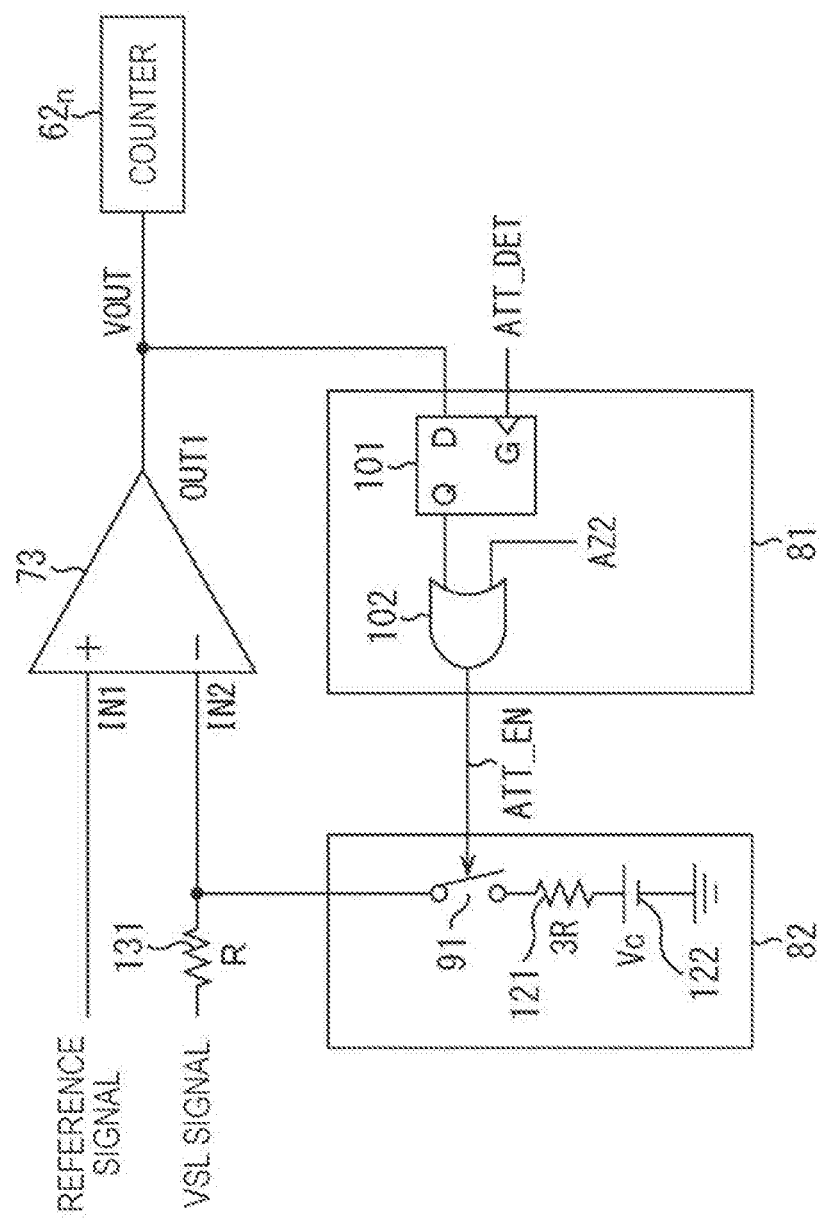
FIG. 17 is a circuit diagram illustrating a fifth exemplary configuration of the control unit 81 and the attenuation unit 82 in a case where the VSL signal is attenuated in accordance with the result of the amplitude determination by using the comparator output VOUT.

FIG. 17 is a circuit diagram illustrating a fifth exemplary configuration of the control unit 81 and the attenuation unit 82 in a case where the amplitude determination is performed by using the comparator output VOUT and the attenuation of the VSL signal is performed in accordance with a result of the determination.

Note that any part in FIG. 17 corresponding to that in FIG. 11 is denoted by the same reference sign, and description thereof will be omitted as appropriate in the following.

In FIG. 17, the control unit 81 is configured similarly to the case illustrated in FIG. 11.

In addition, in FIG. 17, the attenuation unit 82 includes the switch 91, a resistor 121, and a power source 122.

Thus, in FIG. 17, the attenuation unit 82 includes the switch 91, which is same as the case of FIG. 11. However, in FIG. 17, the attenuation unit 82 includes the resistor 121 and the power source 122 in place of the capacitor 92, which is different from the case of FIG. 11.

Note that, in FIG. 17, no auto zero processing capacitors 71 and 72 are provided, and furthermore, no switches 74 and 75 are provided since no capacitors 71 and 72 are provided.

In addition, in FIG. 17, the resistor 121 and a resistor 131 through which voltage division of the VSL signal is performed are provided in place of the capacitor 71.

The resistors 121 and 131 have resistance values 3R and R, respectively.

At the attenuation unit 82 configured as described above, in a case where the switch 91 is on, the VSL signal is attenuated through voltage division at the resistors 131 and 121 and input to the inverting input terminal IN2 of the comparator 73.

In addition, in a case where the switch 91 is off, the VSL signal is input to the inverting input terminal IN2 of the comparator 73 without voltage division through the resistor 131.

Note that the power source 122 is a direct-current power source at a predetermined voltage Vc for adjusting the DC level of the inverting input terminal IN2.

<Outline of Image Sensor to which Present Technology is Applicable>

Figure 18A:
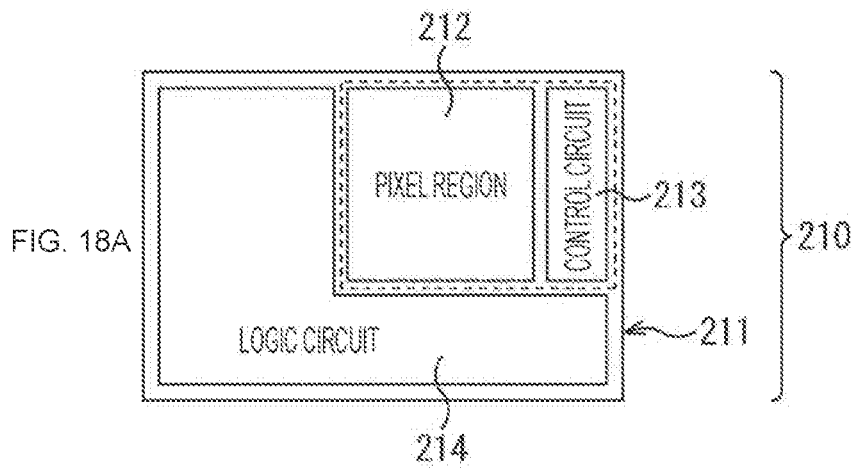
FIGS. 18A, 18B, and 18C is a are diagrams illustrating the outline of an exemplary configuration of an image sensor (solid-state image capturing device) to which the present technology is applicable.
Figure 18B:
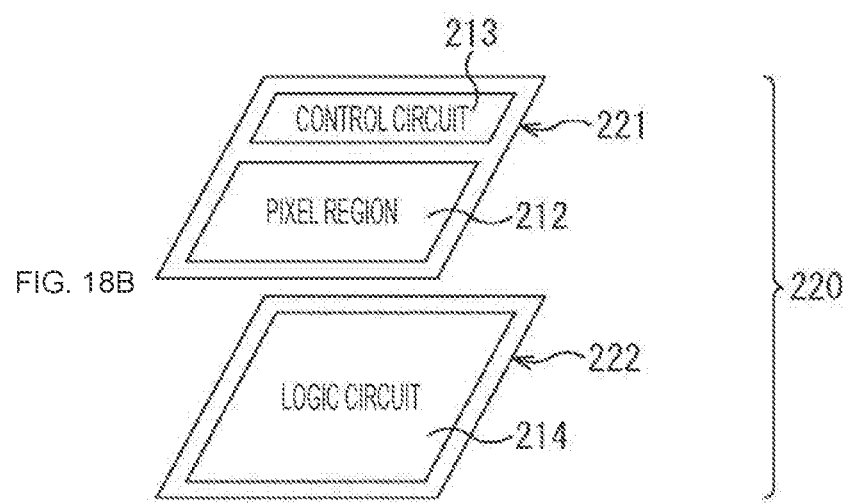
Figure 18C:
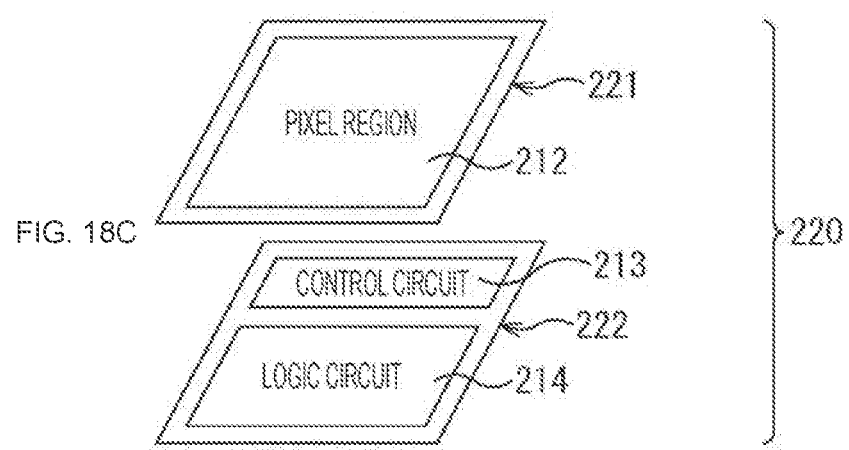

FIGS. 18A, 18B, and 18C are diagrams illustrating the outline of an exemplary configuration of an image sensor (solid-state image capturing device) to which the present technology is applicable.

FIG. 18A illustrates an exemplary schematic configuration of a non-stacking-type image sensor. This image sensor 210 includes one die (semiconductor substrate) 211 as illustrated in FIG. 18A. The die 211 includes a pixel region 212 in which pixels are disposed in an array, a control circuit 213 configured to perform driving of the pixels and other various kinds of control, and a logic circuit 214 configured to perform signal processing.

FIGS. 18B and 18C illustrate an exemplary schematic configuration of a stacking-type image sensor. As illustrated in FIGS. 18B and 18C, this image sensor 220 includes two stacked dies of a sensor die 221 and a logic die 222 electrically connected with each other as one semiconductor chip.

In FIG. 18B, the sensor die 221 includes the pixel region 212 and the control circuit 213, and the logic die 222 includes the logic circuit 214 including a signal processing circuit configured to perform signal processing.

In FIG. 18C, the sensor die 221 includes the pixel region 212, and the logic die 222 includes the control circuit 213 and the logic circuit 214.

The present technology is applicable to a non-stacking-type image sensor as illustrated in FIG. 18A and also applicable to stacking-type image sensors as illustrated in FIGS. 18B and 18C.

In addition, although FIGS. 18B and 18C each illustrate a two-layer image sensor including two stacked dies, the present technology is also applicable to an image sensor including three (or more) stacked dies.

Figure 19:
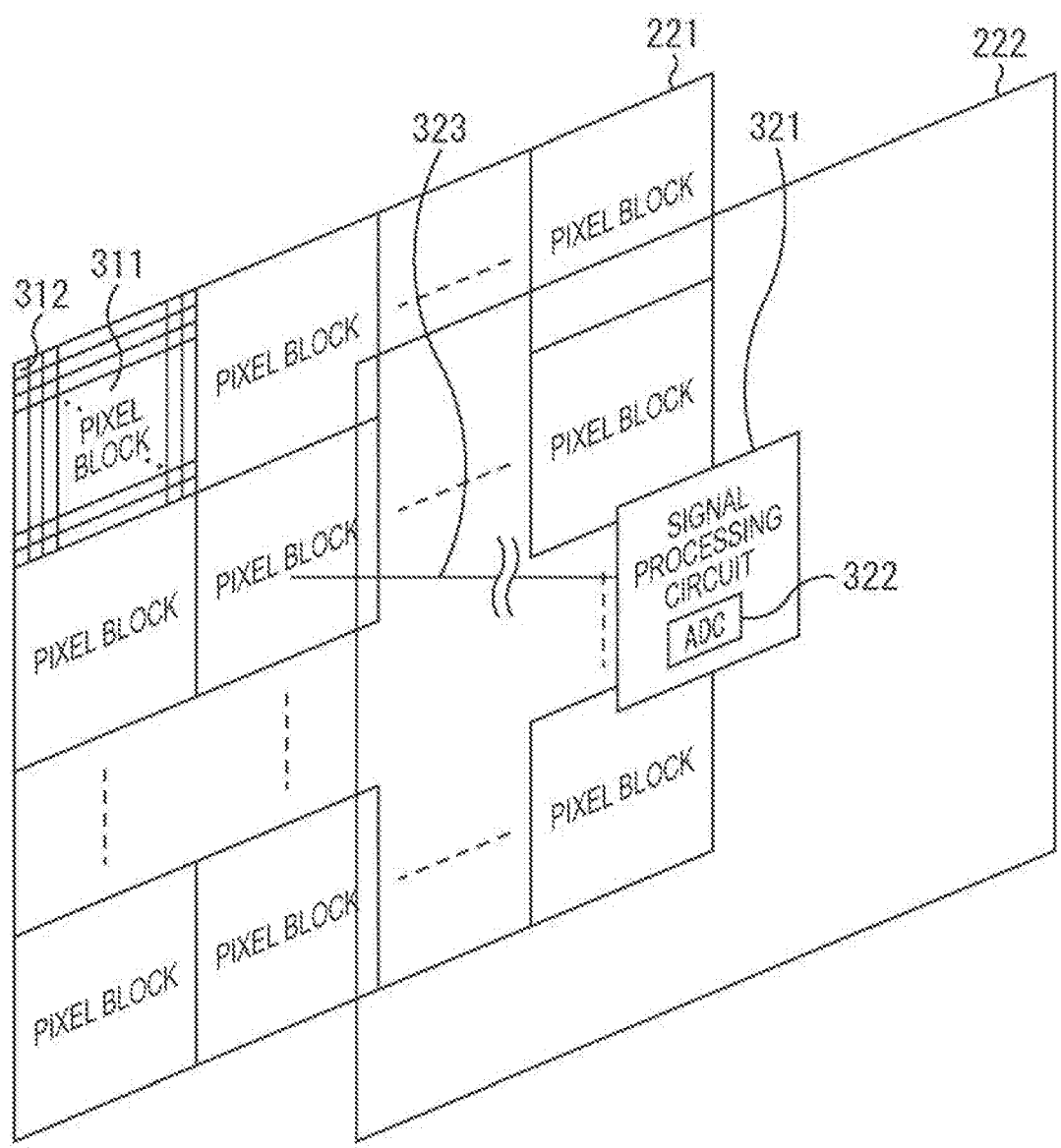
FIG. 19 is a diagram illustrating in detail an exemplary configuration of a two-layer image sensor 220 to which the present technology is applicable.

FIG. 19 is a diagram illustrating a detailed exemplary configuration of the two-layer image sensor 220 to which the present technology is applicable.

In the two-layer image sensor 220 illustrated in FIG. 19, pixels 312 (in the pixel region 212) formed on the sensor die 221 are divided into pixel blocks $31_1$ each including at least one pixel 312. Specifically, the sensor die 221 is divided into the X×Y pixel blocks $31_1$ (X and Y are integers equal to or larger than one).

Signal processing circuits 321 in a number equal to the number of pixel blocks 311, in other words, X×Y signal processing circuits 321 are arranged in an array on the logic die 222.

Each signal processing circuit 321 includes an ADC 322 configured to perform AD conversion of a pixel signal as an electric signal output from each pixel 312 of the corresponding pixel block $31_1$ of the sensor die 221, and a signal processing block (not illustrated) configured to perform various kinds of signal processing such as black level correction and image development.

In the logic die 222, one signal processing circuit 321 has a size approximately equal to that of one pixel block 311, and is disposed at a position facing to the one pixel block 311.

Each signal processing circuit 321 performs signal processing on the pixel signal output from each pixel 312 included in the pixel block $31_1$ at a position facing to the signal processing circuit 321.

Thus, in other words, one pixel block $31_1$ is formed by a set of pixels 312 on which one signal processing circuit 321 performs signal processing. In addition, when the pixel block $31_1$ corresponding to each signal processing circuit 321 is a pixel block $31_1$ as a set of pixels 312 on which the signal processing circuit 321 performs signal processing and any other processing, the signal processing circuit 321 is arrayed at a position facing to the corresponding pixel block $31_1$ in the logic die 222.

Each signal processing circuit 321 is connected with the pixel block $31_1$ corresponding to the signal processing circuit 321 (or disposed at a position facing to the signal processing circuit 321) through a signal line 323.

The pixel signal output from each pixel 312 of the pixel block $31_1$ is supplied to the signal processing circuit 321 corresponding to the pixel block $31_1$ through the signal line 323. The ADC 322 included in the signal processing circuit 321 performs AD conversion of the pixel signal supplied from the pixel 312 of the corresponding pixel block $31_1$ through the signal line 323.

Such an AD conversion scheme is called an area AD conversion (ADC) scheme. According to the area ADC scheme, AD conversion can be performed in parallel on pixel signals in a number equal to the number of signal processing circuits 321, which is equal to X×Y. This is similar to signal processing other than the AD conversion.

The present technology is applicable to the ADC 322 of the image sensor 220 that employs the area ADC scheme as described above.

Specifically, the present technology is applicable to any of the line-parallel AD conversion scheme as illustrated in FIG. 2 and the area ADC scheme as illustrated in FIG. 19.

<Exemplary Use of Image Sensor>

Figure 20:
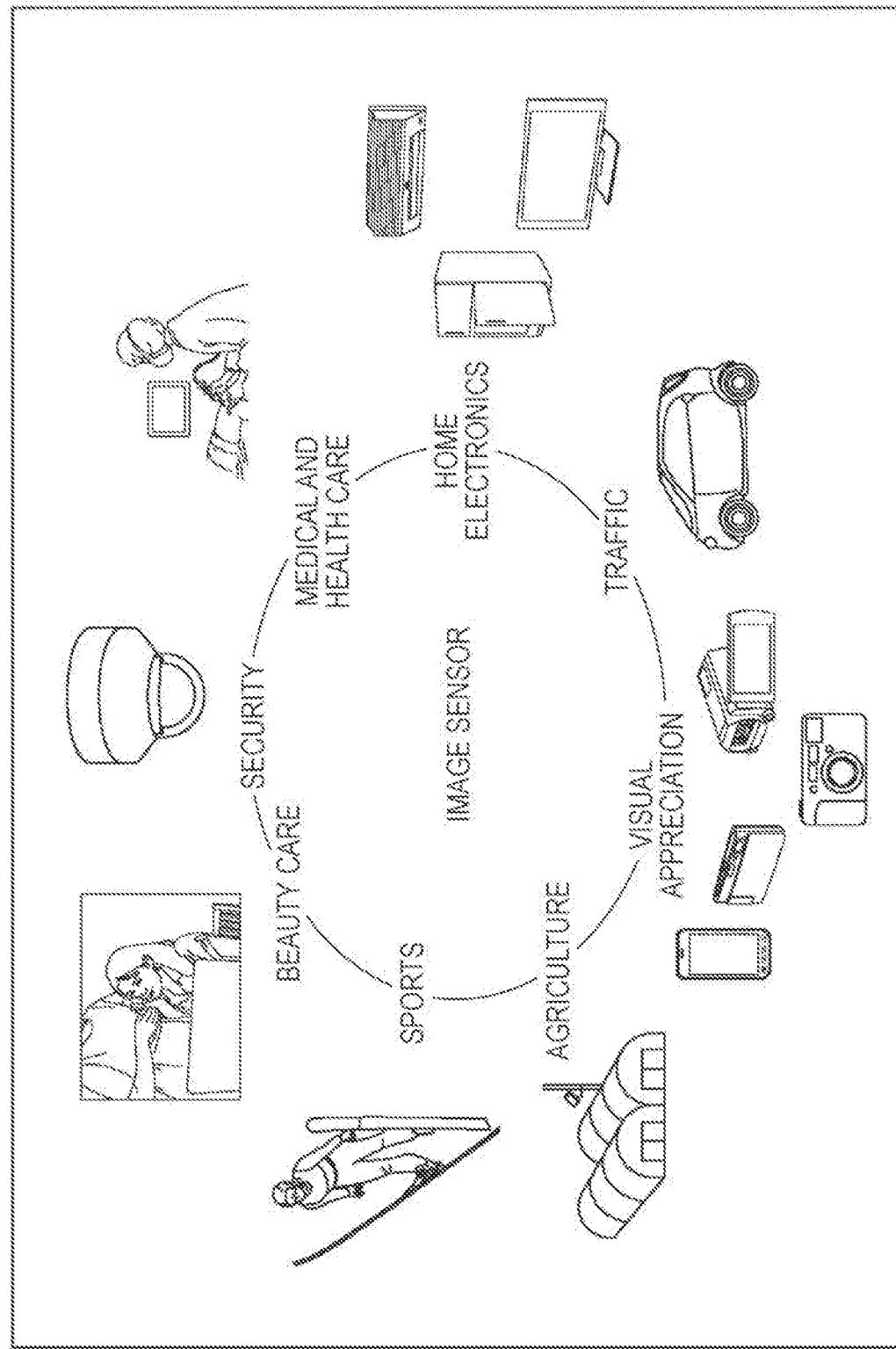
FIG. 20 is a diagram illustrating an exemplary use of the image sensor 2.

FIG. 20 is a diagram illustrating exemplary use of the image sensor 2 in FIG. 1.

The image sensor 2 can be used in, for example, various electronic devices configured to sense light such as visible light, infrared light, ultraviolet light, or X-ray, as described below.

Electronic devices, such as a digital camera and a portable instrument having a camera function, configured to capture images for visual appreciation.

Traffic electronic devices such as an on-board sensor configured to perform image capturing of the front and rear sides, circumference, inside, and the like of an automobile, travel vehicle for safety operation such as automatic stopping and recognition of a driver state and the like, a monitoring camera configured to monitor roads, and a distance measurement sensor configured to perform measurement of, for example, the distance between vehicles.

Electronic devices configured to capture an image of a user gesture to perform an instrument operation in accordance with the gesture and provided to home electronics such as a TV, a refrigerator, and an air conditioner.

Medical and healthcare electronic devices such as an endoscope, an electron microscope, and a device configured to perform blood vessel image capturing by receiving infrared light.

Security electronic devices such as an anti-crime monitoring camera and a personal authentication camera.

Beauty care electronic devices such as a skin measurement device configured to capture an image of skin and a micro scope configured to capture an image of scalp.

Sport electronic devices such as an action camera and a wearable camera for sport usage and the like.

Agricultural electronic devices such as a camera for monitoring the states of fields and crops.

Note that embodiments of the present technology are not limited to the above-described embodiments, and may be changed in various manners without departing from the scope of the present technology.

For example, the present technology is applicable to, in addition to an image sensor configured to sense a visible light ray, an image sensor configured to sense any electromagnetic waves such as an infrared ray, other than a visible light ray.

In addition, the present technology is applicable to AD conversion of an electric signal other than an electric signal output from a pixel in an image sensor, in other words, an analog electric signal output from, for example, a microphone configured to sense sound or a sensor configured to sense any other optional physical quantity.

In addition, the present technology is also applicable to AD conversion of an optional analog signal in place of an electric signal output from a sensor.

Effects described herein are merely exemplary. The present technology is not limited to those effects, and may achieve any other effect.

Note that the present technology may have configurations as follows.

<1>

A sensor including:

an AD conversion unit that includes a comparator configured to compare an electric signal obtained by sensing a physical quantity with a reference signal having a variable level and performs analog-to-digital (AD) conversion of the electric signal by using a result of the comparison between the electric signal and the reference signal by the comparator; and an attenuation unit configured to attenuate the electric signal input to the comparator in accordance with an amplitude of the electric signal.

<2>

The sensor according to <1>, further including a control unit configured to control the attenuation unit to attenuate the electric signal in accordance with the amplitude of the electric signal.

<3>

The sensor according to <1> or <2>, in which the attenuation unit attenuates the electric signal in accordance with the amplitude of the electric signal obtained from the result of the comparison by the comparator.

<4>

The sensor according to any one of <1> to <3>, in which the electric signal is input to the comparator through an auto zero processing capacitor used in auto zero processing in which the comparator is set to obtain such a result of the comparison that the electric signal matches with the reference signal, and the attenuation unit attenuates the electric signal through voltage division of the electric signal input to the comparator by using the auto zero processing capacitor.

<5>

The sensor according to any one of <1> to <4>, further including a pixel that includes a photoelectric conversion element configured to perform photoelectric conversion and outputs the electric signal.

<6>

A driving method performed by a sensor including an AD conversion unit that includes a comparator configured to compare an electric signal obtained by sensing a physical quantity with a reference signal having a variable level and performs analog-to-digital (AD) conversion of the electric signal by using a result of the comparison between the electric signal and the reference signal by the comparator, the method including a step of attenuating the electric signal input to the comparator in accordance with an amplitude of the electric signal.

<7>

An electronic device including:

an optical system configured to condense light; and an image sensor configured to receive light and output a signal corresponding to a received amount of the light, in which the image sensor includes:

a pixel that includes a photoelectric conversion element configured to perform photoelectric conversion and outputs an electric signal;

a reference signal output unit configured to output a reference signal having a variable level;

an AD conversion unit that includes a comparator configured to compare the electric signal output from the pixel with the reference signal and performs analog-to-digital (AD) conversion of the electric signal by using a result of the comparison between the electric signal and the reference signal by the comparator; and an attenuation unit configured to attenuate the electric signal input to the comparator in accordance with an amplitude of the electric signal.

REFERENCE SIGNS LIST

1 Optical system
2 Image sensor
3 Memory
4 Signal processing unit
5 Output unit
6 Control unit
10 Pixel array
$11_{1,1}$ to $11_{M,N}$ Pixel
20 Control unit
21 Pixel drive unit
22 Line-parallel AD conversion device
$31_1$ to $31_N$ ADC
32 Auto zero control unit
32A Auto zero control line
33 Reference signal output unit
33A Reference signal line
34 Clock output unit
34A Clock line
$41_1$ to $41_M$ Pixel control line
$42_1$ to $42_N$ VSL
$43_1$ to $43_N$ Current source
51 PD
52 Transfer Tr
53 FD
54 Reset Tr
55 Amplification Tr
56 Selection Tr
$61_1$ to $61_N$ Comparison unit
$62_1$ to $62_N$ Counter
71, 72 Capacitor
73 Comparator
74, 75 Switch
81 Control unit
82 Attenuation unit
91 Switch
92 Capacitor
101 D flip-flop
102 OR gate
111 Capacitor
112 Switch
121 Resistor
122 Power source
131 Resistor
210 Image sensor
211 Die
212 Pixel region
213 Control circuit
214 Logic circuit
220 Image sensor
221 Sensor die
222 Logic die
311 Pixel block
312 Pixel
321 Signal processing circuit
322 ADC
323 Signal line

The invention claimed is:

1. A sensor, comprising:
an AD conversion circuit that comprises a comparator circuit, wherein
the comparator circuit is configured to:
receive an electric signal through an auto zero processing capacitor; and
compare the electric signal with a reference signal, the reference signal has a variable level, and
the AD conversion circuit is configured to execute analog-to-digital (AD) conversion of the electric signal based on a result of the comparison between the electric signal and the reference signal; and
an attenuation circuit configured to attenuate the electric signal based on:
an amplitude of the electric signal, and
voltage division of the electric signal by the auto zero processing capacitor and a specific capacitor, wherein the attenuation circuit includes the specific capacitor.

2. The sensor according to claim 1, further comprising a control circuit configured to control the attenuation circuit to attenuate the electric signal.

3. The sensor according to claim 1, wherein the amplitude of the electric signal is based on the result of the comparison.

4. The sensor according to claim 1, wherein
the comparator circuit is further configured to:
execute an auto zero process by the auto zero processing capacitor; and
obtain the result of the comparison based on the execution of the auto zero process, wherein the result of the comparison indicates that the electric signal matches with the reference signal.

5. The sensor according to claim 1, further comprising a pixel that includes a photoelectric conversion element configured to:
execute photoelectric conversion on light incident on the pixel; and
output the electric signal based on the photoelectric conversion.

6. The sensor according to claim 1, wherein
the attenuation circuit is further configured to attenuate the electric signal based on the amplitude of the electric signal that exceeds a specific threshold, and
the comparator circuit is further configured to output a high level signal based on the amplitude of the electric signal that exceeds the specific threshold.

7. The sensor according to claim 1, wherein the attenuation circuit further includes a switch between the auto zero processing capacitor and the specific capacitor.

8. A driving method, comprising:
in a sensor including an AD conversion circuit, a comparator circuit, and an attenuation circuit:
receiving, by the comparator circuit, an electric signal through an auto zero processing capacitor;
comparing, by the comparator circuit, the electric signal with a reference signal, wherein the reference signal has a variable level,
executing, by the AD conversion circuit, analog-to-digital (AD) conversion of the electric signal based on a result of the comparison between the electric signal and the reference signal; and attenuating, by the attenuation circuit, the electric signal based on:
an amplitude of the electric signal, and
voltage division of the electric signal by the auto zero processing capacitor and a specific capacitor, wherein the attenuation circuit includes the specific capacitor.

9. An electronic device, comprising:
an optical system configured to condense light; and
an image sensor configured to:
receive light; and
output a specific signal corresponding to an amount of the received light, wherein the image sensor includes:
a pixel that includes a photoelectric conversion element configured to:
execute photoelectric conversion on light incident on the pixel; and
output an electric signal based on the photoelectric conversion;
a reference signal output circuit configured to output a reference signal having a variable level;
an AD conversion circuit that comprises a comparator circuit, wherein
the comparator circuit is configured to:
receive the electric signal through an auto zero processing capacitor; and
compare the electric signal with the reference signal, and
the AD conversion circuit is configured to execute analog-to-digital (AD) conversion of the electric signal based on a result of the comparison between the electric signal and the reference signal; and
an attenuation circuit configured to attenuate the electric signal based on:
an amplitude of the electric signal, and
voltage division of the electric signal by the auto zero processing capacitor and a specific capacitor, wherein the attenuation circuit includes the specific capacitor.

* * * * *